United States Patent
Song

(10) Patent No.: US 9,013,936 B2
(45) Date of Patent: Apr. 21, 2015

(54) MEMORY AND MEMORY SYSTEM INCLUDING THE SAME

(71) Applicant: SK Hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 123 days.

(21) Appl. No.: 13/840,715

(22) Filed: Mar. 15, 2013

(65) Prior Publication Data
US 2014/0063994 A1 Mar. 6, 2014

(30) Foreign Application Priority Data

Aug. 31, 2012 (KR) .......................... 10-2012-0096580

(51) Int. Cl.
*G11C 7/00* (2006.01)
*G11C 29/04* (2006.01)
*G11C 8/14* (2006.01)
*G11C 29/00* (2006.01)

(52) U.S. Cl.
CPC *G11C 29/04* (2013.01); *G11C 8/14* (2013.01); *G11C 29/848* (2013.01); *G11C 29/702* (2013.01)

(58) Field of Classification Search
CPC .......... G11C 29/00; G11C 29/04; G11C 7/00; G11C 8/08; G11C 8/00; G11C 29/02; G11C 29/24; G11C 29/50
USPC ............... 365/200, 222, 201, 230.06, 185.09, 365/230.03, 225.7
See application file for complete search history.

(56) References Cited

U.S. PATENT DOCUMENTS

| | | | |
|---|---|---|---|
| 6,005,810 A | 12/1999 | Wu | |
| 6,195,299 B1 * | 2/2001 | Sugibayashi | ................ 365/200 |
| 6,894,917 B2 | 5/2005 | Ting et al. | |

* cited by examiner

*Primary Examiner* — Thong Q Le
(74) *Attorney, Agent, or Firm* — IP & T Group LLP

(57) ABSTRACT

A memory includes first to $N^{th}$ word lines, first to $M^{th}$ redundancy word lines configured to replace M number of word lines among the first to $N^{th}$ word lines, and a control circuit configured to activate at least one adjacent word line adjacent to a $K^{th}$ redundancy word line ($1 \leq K \leq M$) in response to an active signal, in the case where a word line corresponding to an inputted address among the first to $N^{th}$ word lines is replaced with the $K^{th}$ redundancy word line among the first to $M^{th}$ redundancy word lines in a first mode.

41 Claims, 10 Drawing Sheets

MEMORY AND MEMORY SYSTEM INCLUDING THE SAME

CROSS-REFERENCE TO RELATED APPLICATIONS

The present application claims priority of Korean Patent Application No. 10-2012-0096580, filed on Aug. 31, 2012, which is incorporated herein by reference in its entirety.

BACKGROUND

1. Field

Exemplary embodiments of the present invention relate to a memory that may prevent degradation of stored data due to word line disturbance in a memory cell, and a memory system including the same.

2. Description of the Related Art

As the degree of integration of a memory increases, an interval between a plurality of word lines included in the memory is reduced. As the interval between the word lines is reduced, a coupling effect between adjacent word lines increases.

Whenever data is inputted and outputted to and from a memory cell, a word line toggles between an activated (active) state and a deactivated (inactive) state. In this regard, as the coupling effect between adjacent word lines increases as described above, a phenomenon occurs, in which a data of a memory cell connected to a word line adjacent to a frequently activated word line is damaged. Such a phenomenon is called word line disturbance. Due to the word line disturbance, a concern may be raised in that the data of a memory cell may be damaged before the memory cell is refreshed.

FIG. 1 is a diagram illustrating word line disturbance and illustrating a part of a cell array included in a memory.

In FIG. 1, 'WLL' indicates a word line having the large number of activation times, and 'WLL−1' and 'WLL+1' indicate word lines that are adjacent to the 'WLL', that is, word lines which are adjacent to the word line having the large number of activation times. Furthermore, 'CL' indicates a memory cell connected to the word line 'WLL', 'CL−1' indicates a memory cell connected to the word line 'WLL−1', and 'CL+1' indicates a memory cell connected to the word line 'WLL+1'. The respective memory cells 'CL', 'CL−1' and 'CL+1' include cell transistors TL, TL−1 and TL+1 and cell capacitors CAPL, CAPL−1 and CAPL+1.

In FIG. 1, when the word line 'WLL' is activated or deactivated, the voltages of the word lines 'WLL−1' and 'WLL+1' are increased or decreased due to a coupling effect occurring among the word lines 'WLL', 'WLL−1' and 'WLL+1', and an influence is exerted on the amounts of charges of the cell capacitors CAPL−1 and CAPL+1. Therefore, frequent toggles of the word line 'WLL' between an activated state and a deactivated state lead to increased changes in the amounts of charges stored in the cell capacitors CAPL−1 and CAPL+1 included in the memory cells 'CL−1' and the 'CL+1', so that the data of the memory cells 'CL−1' and the 'CL+1' may be degraded.

Furthermore, as electromagnetic waves, which are generated while the word line toggles between the activated state and the deactivated state, introduce or discharge electrons into or from the cell capacitors of the memory cells connected to adjacent word lines, data may be damaged.

SUMMARY

Various embodiments are directed to a memory, in which word lines adjacent to a word line having the number of activation times equal to or greater than a reference number of times are activated to refresh memory cells connected to themselves, thereby preventing word line disturbance to the data of the memory cells connected to the adjacent word lines.

Also, various embodiments are directed to a memory, in which, even when a word line having the number of activation times equal to or greater than a reference number of times is a redundancy word line replacing a normal word line, it may be possible to prevent word line disturbance to the data of the memory cells connected to word lines adjacent to the redundancy word line.

In an embodiment, a memory may include first to $N^{th}$ word lines, first to $M^{th}$ redundancy word lines configured to replace M number of word lines among the first to $N^{th}$ word lines, and a control circuit configured to activate at least one adjacent word line adjacent to a $K^{th}$ redundancy word line ($1 \leq K \leq M$) in response to an active signal, in the case where a word line corresponding to an inputted address among the first to $N^{th}$ word lines is replaced with the $K^{th}$ redundancy word line among the first to $M^{th}$ redundancy word lines in a first mode.

In an embodiment, a memory may include first to $N^{th}$ word lines, first to $M^{th}$ redundancy word lines configured to replace M number of word lines among the first to $N^{th}$ word lines, a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line, an adjacent activation control block configured to activate at least one adjacent control signal in the case where the word line corresponding to the inputted address among the first to $N^{th}$ word lines is replaced with the $K^{th}$ redundancy word line in a first mode, and a word line control block configured to activate at least one adjacent word line adjacent to the $K^{th}$ redundancy word line in response to an active signal, the adjacent control signal, and the $K^{th}$ redundancy signal, in the case where the word line corresponding to the inputted address is replaced with the $K^{th}$ redundancy word line in the first mode.

In an embodiment, a memory system may include a memory including first to $N^{th}$ word lines and first to $M^{th}$ redundancy word lines configured to replace M number of word lines among the first to $N^{th}$ word lines, and configured to activate at least one adjacent word line adjacent to a $K^{th}$ redundancy word line ($1 \leq K \leq M$) in response to an active signal, in the case where a word line corresponding to an inputted address among the first to $N^{th}$ word lines is replaced with the $K^{th}$ redundancy word line among the first to $M^{th}$ redundancy word lines in a first mode, and a memory controller configured to input an address corresponding to a word line of which the number of activations is equal to or greater than a reference number among the first to $N^{th}$ word lines in the first mode to the memory in response to a result of counting the numbers of activations of the first to $N^{th}$ word lines.

In an embodiment, a memory system may include a memory and a memory controller, the memory including first to $N^{th}$ word lines, first to $M^{th}$ redundancy word lines configure to replace M number of word lines among the first to $N^{th}$ word lines, a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line, an adjacent activation control block configured to sequentially activate at least one adjacent control signal in the case where the word line corresponding to the inputted address among the first to $N^{th}$ word lines is replaced with the $K^{th}$ redundancy word line in a first mode, and a word line control block configured to activate at least one adjacent word line adjacent to the $K^{th}$ redundancy word line in response to an active signal, the adjacent control signal, and the $K^{th}$ redundancy signal, in the case where the word line corresponding to the inputted address is replaced with the $K^{th}$ redundancy word line in the first mode, and the memory controller being configured to input an address corresponding to a word line of which the number of activation times is equal to or greater than a reference number of times among the first to $N^{th}$ word lines in the first mode to the memory in response to a result of counting the numbers of activation times of the first to $N^{th}$ word lines.

In an embodiment, a memory may include first to $M^{th}$ word lines, an adjacent activation control block configured to generate at least one adjacent control signal and to activate the adjacent control signal in response to an active signal in a first mode, and a word line control block configured to generate first to $M^{th}$ control signals corresponding to the first to $M^{th}$ word lines, to activate, in the case where an inputted address corresponds to a $K^{th}$ word line ($1 \leq K \leq M$) among the first to $M^{th}$ word lines, a $K^{th}$ control signal that corresponds to the $K^{th}$ word line, and to activate at least one adjacent word line adjacent to the $K^{th}$ word line in response to the active signal, the adjacent control signal, and the $K^{th}$ control signal in the first mode.

In an embodiment, a memory may include first to $N^{th}$ word lines, first to $M^{th}$ redundancy word lines configured to replace M number of word lines among the first to $N^{th}$ word lines, and a control circuit configured to activate at least one word line adjacent to a word line corresponding to an inputted address among the first to $M^{th}$ redundancy word lines in response to an active signal, in the case where the word line corresponding to the inputted address among the first to $N^{th}$ word lines is adjacent to the first redundancy word line in a first mode.

In an embodiment, a memory may include first to $N^{th}$ word lines, first to $M^{th}$ redundancy word lines configured to replace M number of word lines among the first to $N^{th}$ word lines, a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line, an adjacent activation control block configured to activate at least one adjacent control signal in the case where the word line corresponding to the inputted address among the first to $N^{th}$ word lines is adjacent to the first redundancy word line in a first mode, and a word line control block configured to activate at least one word line adjacent to the word line corresponding to the inputted address among the first to $M^{th}$ redundancy word lines in response to an active signal, the adjacent control signal, and a signal indicating that the word line corresponding to the inputted address is selected, in the case where the word line corresponding to the inputted address is adjacent to the first redundancy word line in the first mode.

In an embodiment, a memory may include first to $N^{th}$ word lines, first to $M^{th}$ redundancy word lines configured to replace M number of word lines among the first to $N^{th}$ word lines, and a control circuit configured to activate, in the case where at least one adjacent word line adjacent to a word line designated by an inputted address in a first mode includes at least one word line among the first to $M^{th}$ redundancy word lines, the adjacent word line in response to an active signal.

In an embodiment, a memory may include first to $N^{th}$ word lines, first to $M^{th}$ redundancy word lines configured to replace M number of word lines among the first to $N^{th}$ word lines, a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line, an adjacent activation control block configured to activate at least one adjacent control signal in the case where at least one adjacent word line adjacent to a word line designated by an inputted address among the first to $N^{th}$ word lines in a first mode includes at least one word line among the first to $M^{th}$ redundancy word lines, and a word line control block configured to activate the at least one adjacent word line in response to an active signal, the adjacent control signal, and a signal indicating that the word line designated by the inputted address is selected, in the case where the word line includes at least one word line among the first to $M^{th}$ redundancy word lines in the first mode.

In an embodiment, a memory may include first to $N^{th}$ word lines, first to $M^{th}$ redundancy word lines configured to replace M number of word lines among the first to $N^{th}$ word lines, a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line, a pulse signal generation unit configured to generate a pulse signal at a deactivation time of an active signal, a first shifting unit configured to shift values stored therein when the pulse signal is activated in the case where a redundancy word line state signal is activated in a first mode and to generate a plurality of first signals, a second shifting unit configured to shift values stored therein when the pulse signal is activated in the first mode and to generate a plurality of second signals, a signal generation unit configured to combine the plurality of first signals and the plurality of second signals and to generate at least one adjacent control signal, and a word line control block configured to activate at least one adjacent word line adjacent to the $K^{th}$ redundancy word line in response to the active signal, the adjacent control signal, and the $K^{th}$ redundancy signal, in the case where the word line corresponding to the inputted address is replaced with the $K^{th}$ redundancy word line in the first mode.

DETAILED DESCRIPTION

Figure 1:
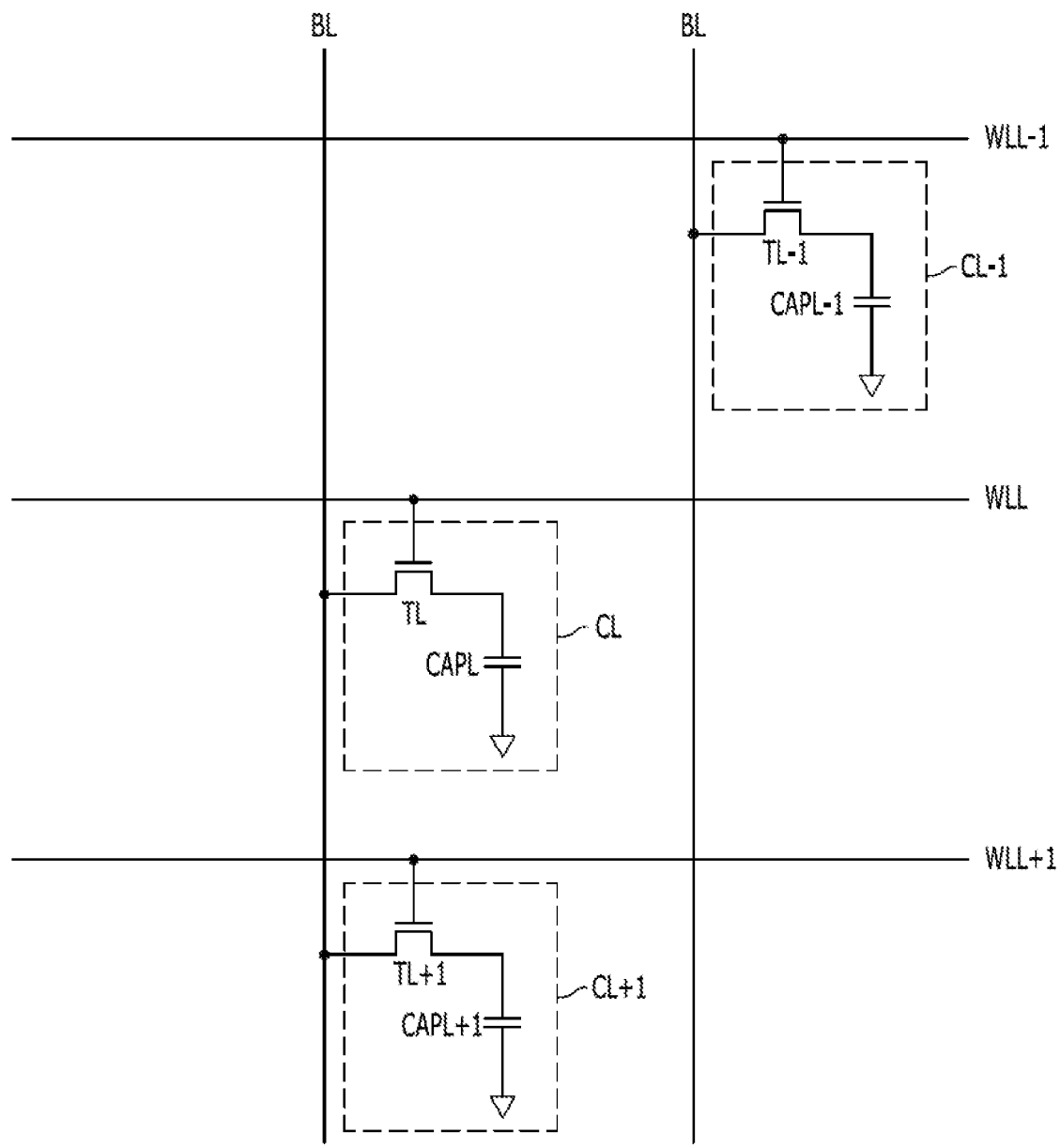
FIG. 1 is a diagram illustrating word line disturbance and illustrating a part of a cell array included in a memory.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Hereinafter, an adjacent word line adjacent means a word line which is identified to be subject to the word line disturbance by a specific word line (for example, an over-activated word line to be disclosed herein below). Identification or the number of the adjacent word lines may vary according to a design. Hereinbelow, descriptions will be made for the case in which two adjacent words are respectively disposed next to the specific word line.

Also, a word line designated by a specific address indicates a word line that physically or logically corresponds to a specific address by a preset correspondence relationship or a word line which replaces the word line corresponding to the specific address. For example, when a word line physically or logically corresponding to an address with the value of 'X' is a Xth word line, if the Xth word line is not replaced, the Xth word line is the word line designated by the address with the value of 'X', and, if the Xth word line is replaced with a Yth redundancy word line, the word line designated by the address with the value of 'X' is the Yth redundancy word line.

Figure 2:
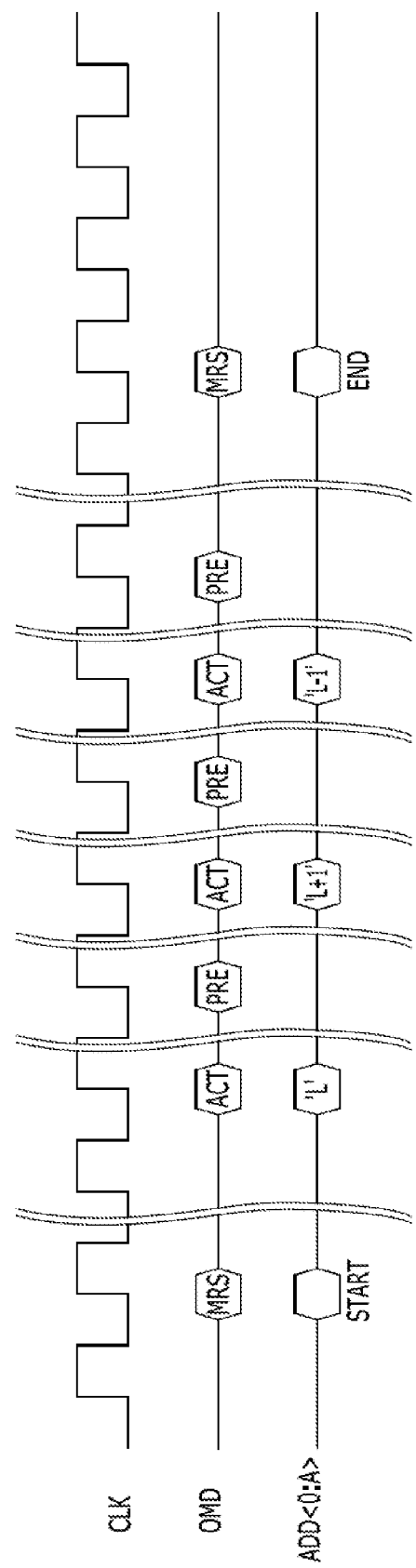
FIG. 2 is a diagram illustrating a method used to substantially prevent the data of memory cells connected to word lines adjacent to a word line having the large number of activation times, from being degraded due to word line disturbance.

FIG. 2 is a diagram explaining prevention of word line disturbance to the data in memory cells connected to word lines adjacent to a word line having the large number of activations.

A memory includes first to $N^{th}$ (N is a natural number) word lines, and a memory controller (not shown in FIG. 2) controls the memory by applying various signals, such as a command CMD, addresses ADD<0:A> and data (not shown in FIG. 2), to the memory. A clock CLK is a clock signal in synchronization with which the memory operates.

FIG. 2 illustrates the signals that the memory controller applies to the memory in an operation mode (hereinafter, referred to as a special mode) to prevent the data of memory cells from being degraded due to word line disturbance. Hereinafter, the value of an address corresponding to an $L^{th}$ word line (L is a natural number, 1≤L≤N) among the first to $N^{th}$ word lines will be denoted by 'L'.

The number of activations of a word line is the number of inputs of an address corresponding to the word line, together with an active command from the memory controller to the memory. For example, when the memory controller inputs an address '15' for ten times together with the active command, it represents that a $15^{th}$ word line is activated ten times. Thus, the memory or the memory controller determines the presence or absence of a word line of which the number of activation times is equal to or greater than a reference number of times, using a result obtained by counting the numbers of times by which the addresses corresponding to the first to $N^{th}$ word lines have been inputted to the memory together with the active command. The reference number of times may be a value that is determined internally of a memory system or a value that is inputted from an outside of the memory system. Value of the reference number of times may vary according to a memory design.

When a specific address combination is inputted from the memory controller together with an MRS command MRS, the memory enters a special mode by MRS (mode resistor set) setting ('START' setting). Furthermore, when a specific address combination is inputted together with the MRS command MRS, the memory exits the special mode ('END' setting). Compensating for data degradation by entering the special mode through the MRS command MRS and the specific address combination is for an illustrative purpose only. For example, it is possible to control the memory to perform the compensating operation using a newly defined signal or an existing signal combination according to a design.

In the special mode, the memory controller operates the memory by the unit of a 'compensation cycle' including an operation of inputting to a memory an address (hereinafter, referred to as an excessive input address) of which the number of input times together with the active command is equal to or greater than the reference number of times and an operation of activating adjacent word lines, or word lines that are adjacent to a word line (hereinafter, referred to as an over-activated word line) corresponding to the excessive input address. Hereinafter, descriptions will be made for the case in which the address 'L' is the excessive input address and the $L^{th}$ word line is the over-activated word line.

In each compensation cycle, a first active command ACT and the excessive input address L are inputted to the memory. After a predetermined time lapses, a precharge command PRE is inputted to the memory. The memory activates the $L^{th}$ word line in response to the active command ACT and the address L, and deactivates the activated $L^{th}$ word line in response to the precharge command PRE.

After the activation of the over-activated word line, addresses L+1 and L−1 corresponding to adjacent word lines adjacent to the $L^{th}$ word line or the over-activated word line are sequentially inputted together with the active command ACT to prevent the word line disturbance. In FIG. 2, a second active command ACT and the address L+1 are inputted, and a third active command ACT and the address L−1 are inputted. Accordingly, an L+$1^{th}$ word line and an L−$1^{th}$ word line of the memory are sequentially activated. For reference, the input order of the address L+1 and the address L−1 may be changed.

When the operation of activating the adjacent word lines is completed, the memory exits the special mode by the combination of the MRS command and an address inputted from the memory controller.

When a certain word line is activated, the data of the memory cells connected to the word line are refreshed. Therefore, in the special mode, by activating the adjacent word lines adjacent to the over-activated word line corresponding to the excessive input address, data degradation may be prevented from occurring due to word line disturbance.

Figure 3:
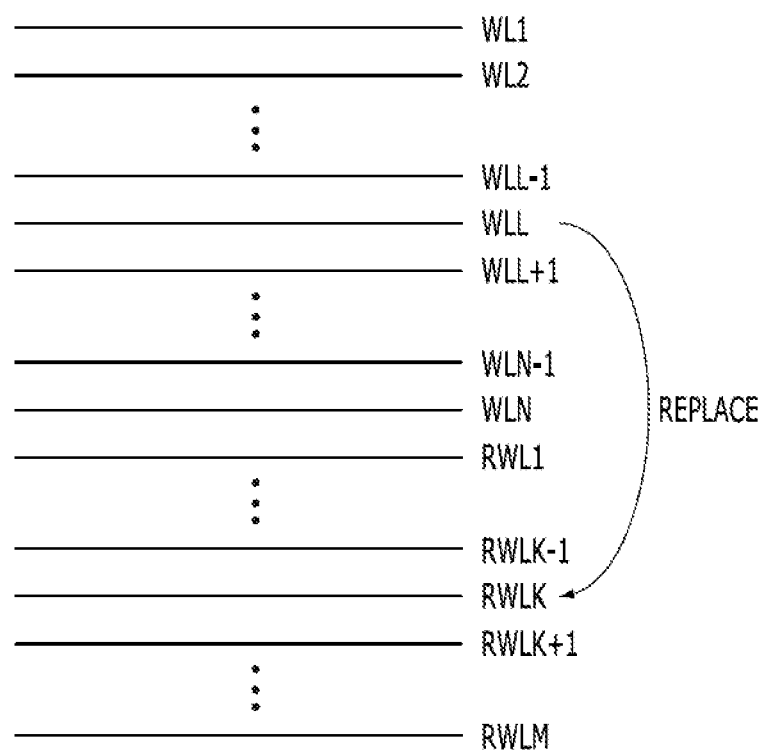
FIG. 3 is a diagram illustrating a concern caused in the case of performing a compensating operation according to the method of FIG. 2.

FIG. 3 is a diagram explaining the compensation process of redundancy word lines.

Referring to FIG. 3, a memory includes first to $N^{th}$ normal word lines WL1 to WLN and first to $M^{th}$ redundancy word lines RWL1 to RWLM to replace failed M normal word lines among the first to $N^{th}$ word lines WL1 to WLN. The first to $N^{th}$ normal word lines WL1 to WLN are sequentially disposed and the first to $M^{th}$ redundancy word lines RWL1 to RWLM are sequentially disposed next to the $N^{th}$ word line WLN, as shown in FIG. 3.

Hereafter, descriptions will be made for the case in which an address L corresponding to an $L^{th}$ word line WLL is an excessive input address and the $L^{th}$ word line is replaced with a $K^{th}$ (K is a natural number, $1 \leq K \leq M$) redundancy word line RWLK.

The memory stores the address L corresponding to the $L^{th}$ word line WLL which is replaced. When the value of an inputted address is identical to L, the memory performs an operation (redundancy operation) of activating the $K^{th}$ redundancy word line RWLK in place of the $L^{th}$ word line WLL. An address is not separately allocated to a redundancy word line.

In a compensation cycle, a first active command ACT and the address L are inputted to the memory. Next, an address L+1 and an address L-1 are inputted together with second and third active commands ACT, respectively. Accordingly, an $L+1^{th}$ word line WLL+1 and an $L-1^{th}$ word line WLL-1 are activated in response to the second and third active commands ACT, respectively.

However, since the $L^{th}$ word line WLL is replaced with the $K^{th}$ redundancy word line RWLK, an over-activated word line is not the $L^{th}$ word line WLL but the $K^{th}$ redundancy word line RWLK, and a word line of which the number of activations is actually equal to or greater than a reference number is not the $L^{th}$ word line WLL but the $K^{th}$ redundancy word line RWLK, even though the excessive input address still corresponds to the $L^{th}$ word line WLL. Thus, word lines to be activated, as adjacent word lines in the special mode, are not the $L+1^{th}$ word line WLL+1 and the $L-1^{th}$ word line WLL-1 but a $K+1^{th}$ redundancy word line RWLK+1 and a $K-1^{th}$ redundancy word line RWLK-1.

Because an address is not allocated to a redundancy word line as described above, a scheme for activating a redundancy word line as an adjacent word line in the special mode is demanded.

Figure 4:
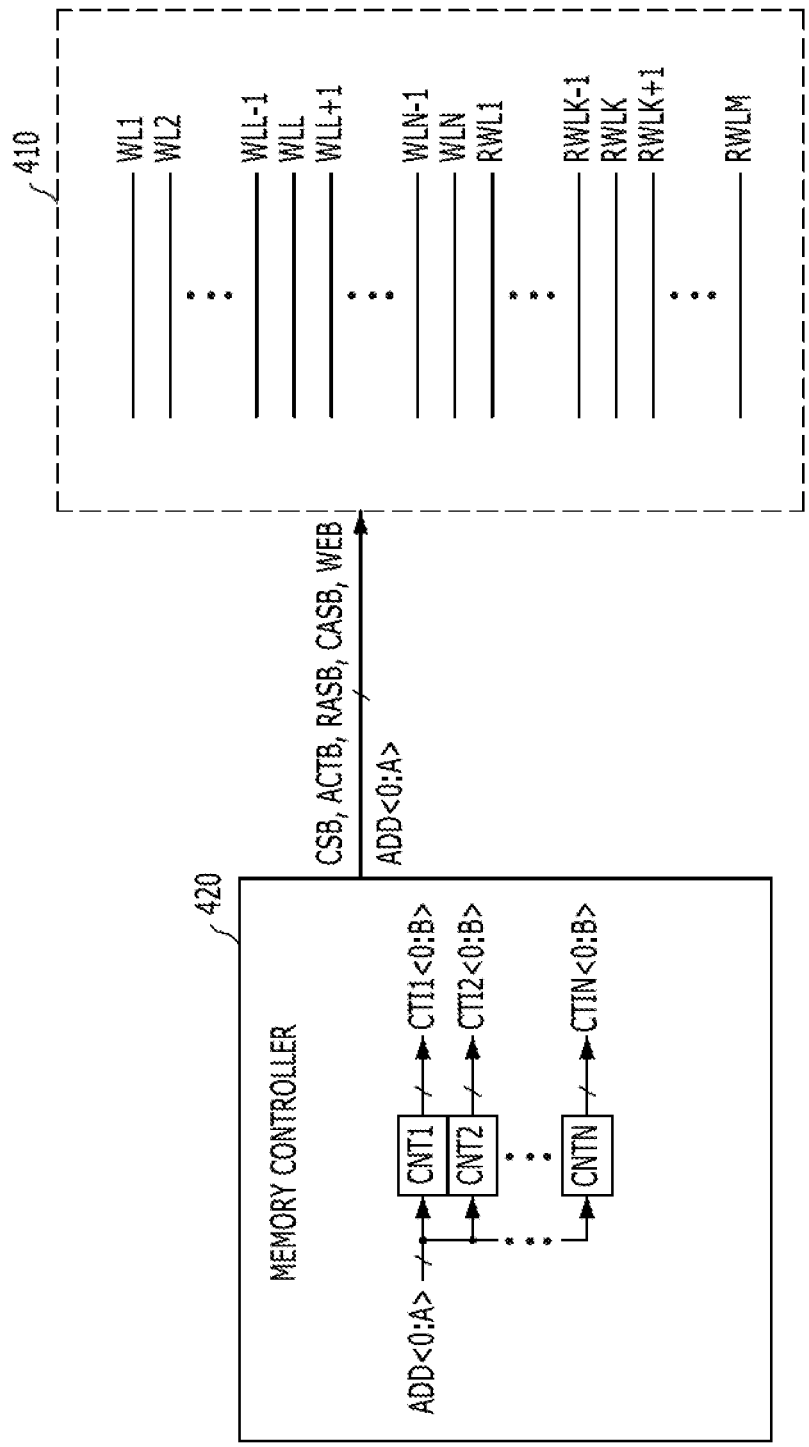
FIG. 4 is a configuration diagram illustrating a memory system in accordance with an embodiment of the present invention.

FIG. 4 is a configuration diagram illustrating a memory system in accordance with an embodiment of the present invention.

A memory 410 includes first to $N^{th}$ normal word lines WL1 to WLN and first to $M^{th}$ redundancy word lines RWL1 to RWLM for replacing failed M normal word lines among the first to $N^{th}$ word lines WL1 to WLN. In the memory 410, the first to $N^{th}$ word lines WL1 to WLN are sequentially disposed, and the first to $M^{th}$ redundancy word lines RWL1 to RWLM are sequentially disposed next to the $N^{th}$ word line WLN. A memory controller 420 inputs an address corresponding to an over-activated word line which is activated at least a reference number of times among the first to $N^{th}$ word lines WL1 to WLN, to the memory 410 in a first mode in response to a result obtained by counting the number of inputs of an address corresponding to each one of the first to $N^{th}$ word lines WL1 to WLN.

For reference, the memory controller 420 inputs command signals including a chip select signal CSB, an active control signal ACTB, a row address strobe signal RASB, a column address strobe signal CASB and a write enable signal WEB, to the memory 410. The fact that the memory controller 420 applies a specific command to the memory 410 represents that the combination of the command signals CSB, ACTB, RASB, CASB and WEB corresponds to the specific command. For example, the fact that the memory controller 420 applies an active command to the memory 410 represents that the combination of the command signals CSB, ACTB, RASB, CASB and WEB applied to the memory 410 by the memory controller 420 corresponds to the active command. A command decoder (not shown) included in the memory 410 decodes the command signals CSB, ACTB, RASB, CASB and WEB and generates a command internally of the memory 410.

In the following descriptions, a first mode corresponds to the aforementioned special mode, and a second mode corresponds to a general operation mode for performing read and write operations for data of the memory 410.

A memory system will be described with reference to FIG. 4.

In the following descriptions, an adjacent word line to a specific word line is a word line that is disposed immediately before or after the specific word line. In FIG. 4, adjacent word lines to an $L^{th}$ word line WLL are an $L-1^{th}$ word line WLL-1 and an $L+1^{th}$ word line WLL+1, and adjacent word lines to a $K^{th}$ redundancy word line RWLK are a $K-1^{th}$ redundancy word line RWLK-1 and a $K+1^{th}$ redundancy word line RWLK+1. Furthermore, an adjacent word line to the first word line WL1 (K=1) is the second word line WL2, adjacent word lines to the $N^{th}$ word line WLN (K=N) are the $N-1^{th}$ word line WLN-1 and the first redundancy word line RWL1, adjacent word lines to the first redundancy word line RWL1 (K=1) are the $N^{th}$ word line WLN and the second redundancy word line RWL2, and an adjacent word line to the $M^{th}$ redundancy word line RWLM (K=M) is the $M-1^{th}$ redundancy word line RWLM-1. Identification or the number of the adjacent word lines may vary according to a design.

In the second mode, the memory 410 or the memory controller 420 counts the numbers of times by which addresses ADD<0:A> corresponding to the respective word lines of the memory 410 are inputted to the memory 410 together with the active command. In order to count the numbers of times by which the addresses corresponding to the first to $N^{th}$ word lines WL1 to WLN are inputted, the memory 410 or the memory controller 420 may include first to $N^{th}$ counting units CNT1 to CNTN, which respectively correspond to the first to $N^{th}$ word lines WL1 to WLN. Even in the case of word line replacement, namely the case that the $L^{th}$ normal word line WLL is replaced with the $K^{th}$ redundancy word line RWLK as the example discussed above, the address corresponding to the normal word line now is mapped to the redundancy word line through the redundancy operation discussed in connection with FIG. 3, and thus the number of activation times of the redundancy word line may be counted with the number of inputs of the address corresponding to the normal word line.

FIG. 4 shows that the memory controller 420 includes the first to $N^{th}$ counting units CNT1 to CNTN. In the second mode, the first to $N^{th}$ counting units CNT1 to CNTN count the values of addresses respectively corresponding to them when the addresses are inputted thereto together with the active command and generate first to $N^{th}$ counting information CTI1<0:B> to CTIN<0:B>. When addresses are inputted to the memory 410 together with the active command, since word lines corresponding to the addresses are activated among the first to $N^{th}$ word lines WL1 to WLN, the number of times that the addresses are inputted together with the active command correspond to the number of times that the first to $N^{th}$ word lines WL1 to WLN are activated. That is to say, the first to $N^{th}$ counting information CTI1<0:B> to CTIN<0:B> is information acquired by counting the number of times that the respective first to $N^{th}$ word lines WL1 to WLN are activated.

The Operation of the Memory System in the First Mode

As the memory controller 420 inputs a combination of MRS commands and a specific address to the memory 410, the memory 410 enters the first mode (a mode signal MOD is activated). The memory controller 420 is configured to input to the memory 410 an excessive input address in the first mode in response to a result of counting the number of activations of the first to $N^{th}$ word lines WL1 to WLN. Since the excessive input address may be at least one, that is, there may be at least one over-activated word line of which the number of activation times is equal to or greater than a reference number, the first mode may include at least one 'compensation cycle' for the case of a plurality of the inputted excessive input addresses. Hereinafter, descriptions will be made for the case where the first mode includes one compensation cycle for one excessive input address corresponding to the $L^{th}$ word line WLL.

After the memory 410 enters the first mode, the memory controller 420 inputs the active command three times to the memory 410 during the compensation cycle. The memory controller 420 inputs the excessive input address ADD<0:A> with the value of L together with a first active command, inputs the address ADD<0:A> with the value of L+1 together with a second active command, and inputs the address ADD<0:A> with the value of L−1 together with a third active command. The number of times by which the active command is inputted to the memory 410 during the compensation cycle may be designed to vary according to the number of adjacent word lines to be activated in the compensation cycle.

Cases (A) and (B) to be described below are where adjacent word lines to an over-activated word line may include at least one redundancy word line.

In case (A) where the over-activated word line is a redundancy word line, or a word line corresponding to the excessive input address ADD<0:A> among the first to $N^{th}$ word lines WL1 to WLN is replaced with the $K^{th}$ (1≤K≤M) redundancy word line RWLK among the first to $M^{th}$ redundancy word lines RWL1 to RWLM, the memory 410 activates at least one adjacent word line to the $K^{th}$ redundancy word line RWLK in response to the active command.

In case (B) where the adjacent word lines partly include at least one redundancy word line, or at least one adjacent word line to an over-activated word line corresponding to the excessive input address ADD<0:A> includes at least one word line among the first to $M^{th}$ redundancy word lines RWL1 to RWLM, the memory 410 activates the adjacent word line to the over-activated word line corresponding to the excessive input address ADD<0:A> among the first to $M^{th}$ redundancy word lines RWL1 to RWLM in response to the active command. For example, case (B) is the one where adjacent word lines to the over-activated $N^{th}$ normal word line WLN are the N−1$^{th}$ normal word line WLN−1 and the first redundancy word line RWL1.

The above cases (A) and (B) correspond to the case in which at least one adjacent word line to the over-activated word line designated by the address ADD<0:A> includes at least one redundancy word line among the first to $M^{th}$ redundancy word lines RWL1 to RWLM. In the case (A) or (B), the memory 410 activates the adjacent word lines, which may include at least one normal word line and at least one redundancy word line, regardless of the inputted address ADD<0:A> for the adjacent word lines.

The Operation of the Memory 410 in Case (A)

When the excessive input address ADD<0:A> with the value of L is inputted together with the first active command, the memory 410 activates the $K^{th}$ redundancy word line RWLK that replaces the $L^{th}$ word line WLL and thus is the over-activated word line. When the second active command is inputted, the memory 410 activates the K+1$^{th}$ redundancy word line RWLK+1 as an adjacent word line to the $K^{th}$ redundancy word line RWLK, regardless of the address ADD<0:A> with the value of L+1 that is applied together with the second active command. When the third active command is inputted, the memory 410 activates the K−1 redundancy word line RWLK−1 as the other adjacent word line to the $K^{th}$ redundancy word line RWLK, regardless of the address ADD<0:A> with the value of L−1 that is applied together with the third active command. The order in which the K+1$^{th}$ redundancy word line RWLK+1 and the K−1$^{th}$ redundancy word line RWLK−1 are activated may be changed. In the case when K is equal to '1', that is, the over-activated word line corresponding to the excessive input address ADD<0:A> is replaced with the first redundancy word line RWL1, the second redundancy word line RWL2 and the $N^{th}$ word line WLN are sequentially activated as adjacent word lines to the over activated word line, namely the first redundancy word line RWL1, in response to the second and third active commands.

The Operation of the Memory 410 in Case (B)

The memory 410 activates the word line corresponding to the excessive input address ADD<0:A> in response to the first active command. The over-activated word line corresponding to the excessive input address ADD<0:A> may be the $N^{th}$ word line WLN which is adjacent to the first redundancy word line RWL1.

When active commands after the first activation are applied, the memory 410 may activate at least one redundancy word line as an adjacent word line to the over-activated word line corresponding to the excessive input address ADD<0:A> among the first to $M^{th}$ redundancy word lines RWL1 to RWLM. For instance, when the second active command is inputted, the memory 410 activates the first redundancy word line RWL1 as an adjacent word line to the over-activated $N^{th}$ word line WLN regardless of the inputted address ADD<0:A> for an adjacent word line, and when the third active command is inputted, the memory 410 activates the N−1$^{th}$ word line WLN−1 as the other adjacent word line to the over-activated $N^{th}$ word line WLN regardless of the inputted address ADD<0:A> for the other adjacent word line. The order in which the first redundancy word line RWL1 and the N−1$^{th}$ word line WLN−1 are activated may be changed.

Except cases (A) and (B), that is, when an over-activated word line and all adjacent word lines are normal word lines, or the word line corresponding to the address ADD<0:A> is not replaced and is not adjacent to the first redundancy word line RWL1, the memory 410 activates the word line corresponding to the address ADD<0:A> inputted together with the active command in the compensation cycle.

Meanwhile, the memory 410 does not perform a redundancy operation (explained in connection with FIG. 3) for the address ADD<0:A> for the adjacent word lines inputted together with the second and third active commands after the first activation in each compensation cycle, and maintains the states of signals associated with the redundancy operation in the states after the first active command for the over-activated word line is inputted. It is a word line physically adjacent to the over-activated word line that needs to be protected against the word line disturbance. Therefore, a nominally adjacent word line, which is not physically adjacent to the over-activated word line, need not be activated for protection from the word line disturbance. The nominally adjacent word line is cause by replacement to a redundancy word line from a normal word line. For example, assume that an excessive input address is 5 and thus the over-activated word line is a fifth word line, and that a fourth word line, which corresponds to an address 4 and is physically adjacent to the over-activated fifth word line, is replaced with a third redundancy word line. Even though the third redundancy word line may be nominally an adjacent word line to the fifth word line according to the replacement, the third redundancy word line is not influenced by word line disturbance since it is not physically adjacent to the over-activated word line or the fifth word line. Accordingly, the memory 410 does not perform a redundancy operation for the address 4 and the third redundancy word line in the compensation cycle.

The Operation of the Memory System in the Second Mode

In order to perform an operation according to an external request (not shown), the memory controller 420 applies the command signals CSB, ACTB, RASB, CASB and WEB, the address ADD<0:A> and data (not shown) to the memory 410. The memory 410 activates a word line corresponding to the address ADD<0:A> when the active command is inputted. In the case where the word line corresponding to the address ADD<0:A> is replaced with a redundancy word line, the memory 410 activates the redundancy word line which replaces the word line corresponding to the address ADD<0:A>.

In the above descriptions, it is explained that, when the memory 410 corresponds to case (A) or (B), at least one word line is activated regardless of the address ADD<0:A> inputted together with the active commands after the first active command for the over-activated word line. The memory 410 may be designed to activate at least one adjacent word line regardless of the address ADD<0:A> inputted together with the active commands after the first active command for the over-activated word line only in case (A) or (B).

In the memory system in accordance with the embodiment of the present invention, even in the case where at least one adjacent word line to be activated in the compensation cycle during the operation in the first mode (the special mode) is a redundancy word line that is not allocated with an address, a normal compensating operation may be performed. Also, by activating only word lines necessary in respective situations, current and power consumption in the compensating operation may be reduced.

Figure 5:
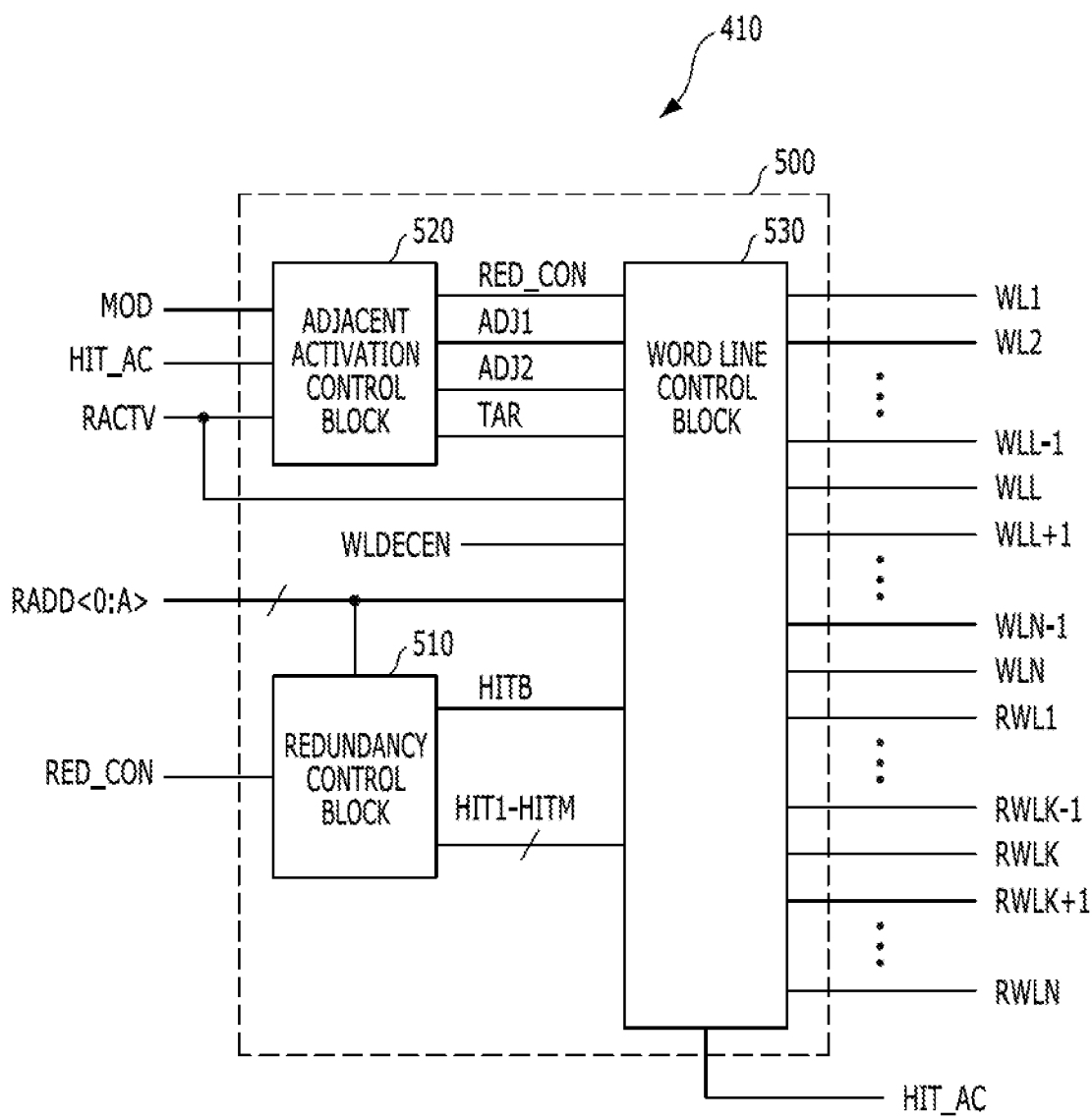
FIG. 5 is a configuration diagram illustrating a memory in accordance with the embodiment of the present invention.

FIG. 5 is a configuration diagram of the memory 410 in accordance with the embodiment of the present invention.

Referring to FIG. 5, the memory 410 includes the first to $N^{th}$ normal word lines WL1 to WLN, the first to $M^{th}$ redundancy word lines RWL1 to RWLM for replacing failed M normal word lines among the first to $N^{th}$ word lines WL1 to WLN, and a control circuit 500. In the memory 410, the first to $N^{th}$ word lines WL1 to WLN are sequentially disposed, and the first to $M^{th}$ redundancy word lines RWL1 to RWLM are sequentially disposed next to the $N^{th}$ word line WLN.

An active signal RACTV is a signal that is activated when the active command (not shown) is applied to the memory 410 and is deactivated when a precharge command (not shown) is applied to the memory 410. An address RADD<0:A> of FIG. 5 is a signal that has the same value as the address ADD<0:A> applied from the memory controller 420 and is synchronized with the internal operation timing of the memory 410.

In the following descriptions, a first mode corresponds to the aforementioned special mode, and a second mode corresponds to a general operation mode for performing read and write operations for data of the memory 410.

The memory 410 will be described with reference to FIG. 5.

The Operation of the Memory 410 in the First Mode

The memory 410 enters the first mode by a combination of MRS commands and a specific address (the mode signal MOD is activated). As disclosed above, the memory controller 420 is configured to input to the memory 410 an excessive input address in the first mode in response to a result of counting the numbers of activation times of the first to $N^{th}$ word lines WL1 to WLN. Since the excessive input address may be at least one, that is, there may be at least one over-activated word line of which the number of activation times is equal to or greater than a reference number of times, the first mode may include at least one compensation cycle for the case of a plurality of the inputted excessive input addresses. Hereinafter, descriptions will be made for the case where the first mode includes one compensation cycle for one excessive input address corresponding to the $L^{th}$ word line WLL.

In case (A) where the over-activated word line is a redundancy word line, or a word line corresponding to the inputted excessive input address RADD<0:A> among the first to $N^{th}$ word lines WL1 to WLN is replaced with the $K^{th}$ (1≤K≤M) redundancy word line RWLK among the first to $M^{th}$ redundancy word lines RWL1 to RWLM, the control circuit 500 activates at least one adjacent word line to the $K^{th}$ redundancy word line RWLK in response to the active signal RACTV.

In case (B) where the adjacent word lines include at least one redundancy word line, or at least one adjacent word line to an over-activated word line corresponding to the inputted excessive input address RADD<0:A> includes at least one word line among the first to $M^{th}$ redundancy word lines RWL1 to RWLM, the control circuit 500 activates the adjacent word line to the over-activated word line corresponding to the inputted excessive input address RADD<0:A> among the first to $M^{th}$ redundancy word lines RWL1 to RWLM in response to the active signal RACTV. For example, case (B) is the one where adjacent word lines to the over-activated $N^{th}$ normal word line WLN are the $N-1^{th}$ normal word line WLN-1 and the first redundancy word line RWL1.

The above cases (A) and (B) correspond to the case in which at least one adjacent word line to the over-activated word line designated by the address RADD<0:A> inputted when the active signal RACTV is first activated in the compensation cycle that includes at least one redundancy word line among the first to $M^{th}$ redundancy word lines RWL1 to RWLM. In the case (A) or (B), the control circuit 500 activates the adjacent word lines, which may include at least one normal word line and at least one redundancy word line, regardless of the inputted address RADD<0:A> for the adjacent word lines.

The Operation of the Control Circuit 500 in Case (A)

When the active signal RACTV is activated for the first time, if the value of the inputted excessive input address RADD<0:A> is L, the control circuit 500 activates the $K^{th}$ redundancy word line RWLK that replaces the $L^{th}$ word line WLL and thus is the over-activated word line. When the active signal RACTV is activated for the second time, the control circuit 500 activates the $K+1^{th}$ redundancy word line RWLK+1 as an adjacent word line to the $K^{th}$ redundancy word line RWLK, regardless of the inputted address RADD<0:A>. When the active signal RACTV is activated for the third time, the control circuit 500 activates the K-1 redundancy word line RWLK-1 as the other adjacent word line to the $K^{th}$ redundancy word line RWLK regardless of the inputted address RADD<0:A>. The order in which the $K+1^{th}$ redundancy word line RWLK+1 and the K−1$^{th}$ redundancy word line RWLK−1 are activated may be changed. In the case where K is equal to one, that is, the over-activated word line corresponding to the excessive input address RADD<0:A> is replaced with the first redundancy word line RWL1, the second redundancy word line RWL2 and the N$^{th}$ word line WLN are sequentially activated as adjacent word lines to the over activated word line, namely the first redundancy word line RWL1, in response to the second and third active signals RACTV.

The Operation of the Control Circuit 500 in Case (B)

The control circuit 500 activates the word line corresponding to the inputted excessive input address RADD<0:A> when the active signal RACTV is activated for the first time. The over-activated word line corresponding to the inputted excessive input address RADD<0:A> may be the N$^{th}$ word line WLN that is adjacent to the first redundancy word line RWL1.

When the active signals RACTV for the adjacent word lines are applied, the control circuit 500 may activate at least one redundancy word line as an adjacent word line to the over-activated word line corresponding to the excessive input address RADD<0:A> among the first to M$^{th}$ redundancy word lines RWL1 to RWLM. For instance, when the active signal RACTV is activated for the second time, the control circuit 500 activates the first redundancy word line RWL1 as an adjacent word line to the over-activated N$^{th}$ word line WLN, regardless of the inputted address RADD<0:A> for an adjacent word line, and when the active signal RACTV is activated for the third time, the control circuit 500 activates the N−1$^{th}$ word line WLN−1 as the other adjacent word line to the over-activated N$^{th}$ word line WLN, regardless of the inputted address RADD<0:A> for the other adjacent word line. The order in which the first redundancy word line RWL1 and the N−1$^{th}$ word line WLN−1 are activated may be changed.

Except cases (A) and (B), that is, when an over-activated word line and all adjacent word lines are normal word lines, or the word line corresponding to the address RADD<0:A> is not replaced and is not adjacent to the first redundancy word line RWL1, the control circuit 500 activates the word line corresponding to the address RADD<0:A> inputted when the active signal RACTV is activated in the compensation cycle.

Meanwhile, the control circuit 500 does not perform a redundancy operation (explained in connection with FIG. 3) for the address RADD<0:A> for the adjacent word lines inputted together with the second and third active signals RACTV after the activation of the over-activated word line in each compensation cycle, and maintains the states of signals associated with the redundancy operation in the states after the first active signal RACTV for the over-activated word line is inputted. It is a word line physically adjacent to the over-activated word line that needs to be protected against the word line disturbance. Therefore, a nominally adjacent word line, which is not physically adjacent to the over-activated word line, need not be activated for protection from the word line disturbance. The nominally adjacent word line is cause by replacement to a redundancy word line from a normal word line. For example, assume that an excessive input address is 5, and thus, the over-activated word line is a fifth word line, and that a fourth word line, which corresponds to an address 4 and is physically adjacent to the over-activated fifth word line, is replaced with a third redundancy word line. Even though the third redundancy word line may be nominally an adjacent word line to the fifth word line according to the replacement, the third redundancy word line is not influenced by word line disturbance since it is not physically adjacent to the over-activated word line or the fifth word line. Accordingly, the control circuit 500 does not perform a redundancy operation for the address 4 and the third redundancy word line in the compensation cycle.

The Operation of the Control Circuit 500 in the Second Mode

The control circuit 500 activates a word line corresponding to the address RADD<0:A> inputted when the active signal RACTV is activated. In the case where the word line corresponding to the inputted address RADD<0:A> is replaced with a redundancy word line, the control circuit 500 activates the redundancy word line which replaces the word line corresponding to the inputted address RADD<0:A>.

In the above descriptions, it is explained that the control circuit 500 of case (A) or (B) activates adjacent word lines regardless of the address RADD<0:A> inputted together with the active signal RACTV after the first active signal RACTV for the over-activated word line. The control circuit 500 may be designed to activate at least one adjacent word line regardless of the address RADD<0:A> inputted together with the active signals RACTV after the first active command for the over-activated word line only in case (A) or (B).

For the above-described operations, referring to FIG. 5, the control circuit 500 includes a redundancy control block 510, an adjacent activation control block 520, and a word line control block 530. Operations of the respective control blocks 510, 520 and 530 will be described below.

The redundancy control block 510 generates first to M$^{th}$ redundancy signals HIT1 to HITM. In the case where the normal word line corresponding to the inputted excessive input address RADD<0:A> among the first to N$^{th}$ word lines WL1 to WLN is replaced with the K$^{th}$ (1≤K≤M) redundancy word line RWLK among the first to M$^{th}$ redundancy word lines RWL1 to RWLM, the redundancy control block 510 activates a K$^{th}$ redundancy signal HITK corresponding to the K$^{th}$ redundancy word line RWLK in response to the inputted excessive input address RADD<0:A>.

In detail, while the redundancy control block 510 stores the address corresponding to the word line to be replaced among the first to N$^{th}$ word lines WL1 to WLN, in the case where a redundancy control signal RED_CON is activated, if the value of the address stored therein is identical to the value of the inputted address RADD<0:A>, the redundancy control block 510 activates corresponding word line from the first to M$^{th}$ redundancy word lines RWL1 to RWLM. At this time, a redundancy enable signal HITB indicating that the redundancy operation is being performed is activated together (The activation level of the redundancy enable signal HITB is a low level). In the case where the redundancy control signal RED_CON is deactivated, the redundancy control block 510 keeps previous states of the first to M$^{th}$ redundancy signals HIT1 to HITM and the redundancy enable signal HITB, regardless of whether the value of the inputted address RADD<0:A> is identical to the value of the address stored therein.

In other words, in the case where the redundancy control signal RED_CON is activated, the redundancy control block 510 compares the inputted address RADD<0:A> with the stored value and updates the first to M$^{th}$ redundancy signals HIT1 to HITM and the redundancy enable signal HITB, and in the case where the redundancy control signal RED_CON is deactivated, the redundancy control block 510 keeps previous states of the first to M$^{th}$ redundancy signals HIT1 to HITM and the redundancy enable signal HITB regardless of a result of comparing the inputted address RADD<0:A> with the stored address.

The redundancy control signal RED_CON is generated by the adjacent activation control block 520, is in a deactivated state during a period from a time at which the first activated active signal RACTV is deactivated to a time at which the third activated active signal RACTV is deactivated in each compensation cycle, and is in an activated state during a remaining period. In the second mode, the redundancy control signal RED_CON is always maintained in the activated state. The third activated active signal RACTV is an active signal RACTV that is finally activated in each compensation cycle. The number of activation time of active signal RACTV depends on the number of adjacent word line that may vary according to a memory design.

Accordingly, the redundancy control block 510 activates one redundancy signal corresponding to the value of the address stored therein among the first to $M^{th}$ redundancy signals HIT1 to HITM and the redundancy enable signal HITB in the case where the value of the address RADD<0:A> inputted when the first active signal RACTV is activated is identical to the value of the address stored therein in each compensation cycle, and keeps current states of the first to $M^{th}$ redundancy signals HIT1 to HITM and the redundancy enable signal HITB during the remaining period of the compensation cycle. Therefore, the redundancy signal activated since the value of the address RADD<0:A> inputted when the active signal RACTV is first activated is identical to the value of the address stored in the redundancy control block 510 stays active. Conversely, the redundancy control block 510 deactivates all the first to $M^{th}$ redundancy signals HIT1 to HITM and the redundancy enable signal HITB in the case where the value of the address RADD<0:A> inputted when the active signal RACTV is first activated is not identical to the value of the address stored therein in the compensation cycle, and keeps these states during the remaining period of the compensation cycle.

In case (A) where the over-activated word line is a redundancy word line, or the word line corresponding to the inputted excessive input address RADD<0:A> among the first to $N^{th}$ word lines WL1 to WLN in the first mode is replaced with the $K^{th}$ redundancy word line RWLK, the adjacent activation control block 520 sequentially activates one or more adjacent control signals ADJ1 and ADJ32. Also, in case (B) where the adjacent word lines partly include at least one redundancy word line, or at least one adjacent word line to an over-activated word line corresponding to the excessive input address RADD<0:A> inputted in the first mode includes at least one word line among the first to $M^{th}$ redundancy word lines RWL1 to RWLM, the adjacent activation control block 520 sequentially activates the one or more adjacent control signals ADJ1 and ADJ2. Namely, in the case where at least one adjacent word line to the over-activated word line designated by the inputted address RADD<0:A> include at least one redundancy word line among the first to $M^{th}$ redundancy word lines RWL1 to RWLM, the adjacent activation control block 520 sequentially activates the one or more adjacent control signals ADJ1 and ADJ2.

In detail, the adjacent activation control block 520 generates the redundancy control signal RED_CON, a target control signal TAR and the one or more adjacent control signals ADJ1 and ADJ2 in response to the mode signal MOD, a redundancy word line state signal HIT_AC and the active signal RACTV. In an initial state, the adjacent activation control block 520 activates the redundancy control signal RED_CON and the target control signal TAR and deactivates the one or more adjacent control signals ADJ1 and ADJ2.

The first adjacent control signal ADJ1 is a signal for activating an adjacent word line disposed after the over-activated word line activated in response to the excessive input address RADD<0:A> inputted together with the first activated active signal RACTV, and the second adjacent control signal ADJ2 is a signal for activating an adjacent word line disposed before the over-activated word line activated in response to the excessive input address RADD<0:A> inputted together with the first activated active signal RACTV. For instance, in the case where the value of the excessive input address RADD<0:A> inputted when the active signal RACTV is first activated is L and the $L^{th}$ word line WLL is replaced with the $K^{th}$ redundancy word line RWLK, the over-activated word line is the $K^{th}$ redundancy word line RWLK, and the first adjacent control signal ADJ1 is a signal for controlling the $K+1^{th}$ redundancy word line RWLK+1, and the second adjacent control signal ADJ2 is a signal for controlling the $K-1^{th}$ redundancy word line RWLK-1. The redundancy word line state signal HIT_AC is a signal for indicating whether a redundancy word line is to be activated or not in the first mode. Identification or the number of the adjacent word lines, and thus the number of the adjacent control signals may vary according to a design.

In the case where both the mode signal MOD and the redundancy word line state signal HIT_AC are activated, namely in case (A) or (B), when the first activated active signal RACTV is deactivated, the adjacent activation control block 520 deactivates the redundancy control signal RED_CON and the target control signal TAR and activates the first adjacent control signal ADJ1. When the second activated active signal RACTV is deactivated, the adjacent activation control block 520 deactivates the first adjacent control signal ADJ1 and activates the second adjacent control signal ADJ2. When the third activated active signal RACTV is deactivated, the adjacent activation control block 520 deactivates the second adjacent control signal ADJ2 and activates the redundancy control signal RED_CON and the target control signal TAR (the compensation cycle ends and return is made to the initial state).

In the case where the mode signal MOD is activated and the redundancy word line state signal HIT_AC is deactivated, which means that an over-activated word line and all adjacent word lines are normal word lines, when the first activated active signal RACTV is deactivated, the adjacent activation control block 520 deactivates the redundancy control signal RED_CON. When the second activated active signal RACTV is deactivated, the adjacent activation control block 520 keeps the previous state (the state in which only the target control signal TAR is activated among the four signals RED_CON, TAR, ADJ1 and ADJ2). When the third activated active signal RACTV is deactivated, the adjacent activation control block 520 activates the redundancy control signal RED_CON (the compensation cycle ends and return is made to the initial state).

In the case where the mode signal MOD is deactivated, the adjacent activation control block 520 maintains the initial state, that is, the state in which the redundancy control signal RED_CON and the target control signal TAR are activated and the one or more adjacent control signals ADJ1 and ADJ2 are deactivated, regardless of toggle of the active signal RACTV.

In case (A) where the over-activated word line is a redundancy word line, or a word line corresponding to the inputted excessive input address RADD<0:A> in the first mode is replaced with the $K^{th}$ redundancy word line RWLK, the word line control block 530 activates at least one adjacent word line to the $K^{th}$ redundancy word line RWLK in response to the active signal RACTV, the one or more adjacent control signals ADJ1 and ADJ2 and the $K^{th}$ redundancy signal HITK.

In case (B) where the adjacent word lines partly include at least one redundancy word line, or an over-activated word line corresponding to the inputted excessive input address RADD<0:A> in the first mode is next to the first redundancy word line RWL1, for example in case of the over-activated $N^{th}$ normal word line WLN, the word line control block 530 activates at least one adjacent word line to the over-activated word line in response to the active signal RACTV, the one or more adjacent control signals ADJ1 and ADJ2 and the first redundancy signal HIT1.

In detail, the word line control block 530 activates an appropriate word line in response to the active signal RACTV, a word line decoding enable signal WLDECEN, the inputted address RADD<0:A>, the target control signal TAR, the first to $M^{th}$ redundancy signals HIT1 to HITM and the redundancy enable signal HITB. The word line decoding enable signal WLDECEN is a signal that is activated with a delay value from the activation time of the active signal RACTV to when whether to activate the redundancy enable signal HITB (whether or not the value of the input address RADD<0:A> is identical to the value of the address stored in the redundancy control block 510) is determined in response to the inputted address RADD<0:A> in the redundancy control block 510, stays active for a predetermined period, and is then deactivated.

With the active signal RACTV deactivated, the word line control block 530 keeps deactivated states of the first to $N^{th}$ word lines WL1 to WLN and the first to $M^{th}$ redundancy word lines RWL1 to RWLM. After the active signal RACTV is activated, an activation of the word line decoding enable signal WLDECEN causes an activation of the word line corresponding to the inputted excessive input address RADD<0:A>.

In the case where a word line corresponding to the excessive input address RADD<0:A> inputted when the active signal RACTV is activated for the first time in the compensation cycle under the first mode is not replaced, the word line control block 530 sequentially activates word lines corresponding to the addresses RADD<0:A> inputted when the active signal RACTV is activated for the second and third times. However, the word line control block 530 does not activate a redundancy word line, which is a replacement of the normal word line corresponding to the addresses RADD<0:A> inputted when the active signal RACTV is activated for the second and third times.

In case (A) where the over-activated word line is a redundancy word line, or a word line corresponding to the excessive input address RADD<0:A> inputted when the active signal RACTV is activated for the first time in the compensation cycle under the first mode is replaced with the $K^{th}$ redundancy word line RWLK, the word line control block 530 activates the $K^{th}$ redundancy word line RWLK in response to the redundancy enable signal HITB, the target control signal TAR and the $K^{th}$ redundancy signal HITK. When the active signal RACTV is activated for the second time, the word line control block 530 does not activate a word line corresponding to the address RADD<0:A> inputted at that time, but the $K+1^{th}$ redundancy word line RWLK+1 in response to the $K^{th}$ redundancy signal HITK and the first adjacent control signal ADJ1. When the active signal RACTV is activated for the third time, the word line control block 530 does not activate a word line corresponding to the address RADD<0:A> inputted at that time, but the $K-1^{th}$ redundancy word line RWLK-1 in response to the $K^{th}$ redundancy signal HITK and the second adjacent control signal ADJ2.

In case (B) where the adjacent word lines include at least one redundancy word line, or a word line corresponding to the excessive input address RADD<0:A> inputted when the active signal RACTV is first activated is the $N^{th}$ word line WLN, when the active signal RACTV is second activated, the word line control block 530 does not activate a word line corresponding to the address RADD<0:A> inputted at that time, but the first redundancy word line RWL1 in response to a signal HWLN, which indicates that the address RADD<0:A> corresponding to the $N^{th}$ word line WLN is inputted, and the first adjacent control signal ADJ1. When the active signal RACTV is activated for the third time, the word line control block 530 does not activate a word line corresponding to the address RADD<0:A> inputted at that time, but the $N-1^{th}$ word line WLN-1 in response to the signal HWLN, which indicates that the address RADD<0:A> corresponding to the $N^{th}$ word line WLN is inputted, and the second adjacent control signal ADJ2.

When operating in the second mode, in the case where a word line corresponding to the inputted address RADD<0:A> is not replaced, the word line control block 530 activates the word line corresponding to the inputted address RADD<0:A>. In the case where a word line corresponding to the inputted address RADD<0:A> is replaced, the word line control block 530 activates a redundancy word line that corresponds to an activated redundancy signal. At this time, a word line corresponding to the address RADD<0:A> inputted in response to the redundancy enable signal HITB is not activated.

In the memory in accordance with the embodiment of the present invention, when operating in the special mode, in case (A) where the over-activated word line is a redundancy word line, or a word line corresponding to the excessive input address inputted together with a first active command in a compensation cycle is replaced with a redundancy word line, or in case (B) where the adjacent word lines partly include at least one redundancy word line, or at least one adjacent word line to an over-activated word line corresponding to the excessive input address RADD<0:A> inputted in the first mode includes at least one redundancy word line, adjacent word lines to the over-activated word line are activated regardless of the address inputted in the corresponding compensation cycle, whereby it is possible to perform a normal compensating operation even when a normal word line is replaced with a redundancy word line. Also, since only word lines necessary in each situation are activated, current and power consumption in the compensating operation may be reduced.

Figure 6:
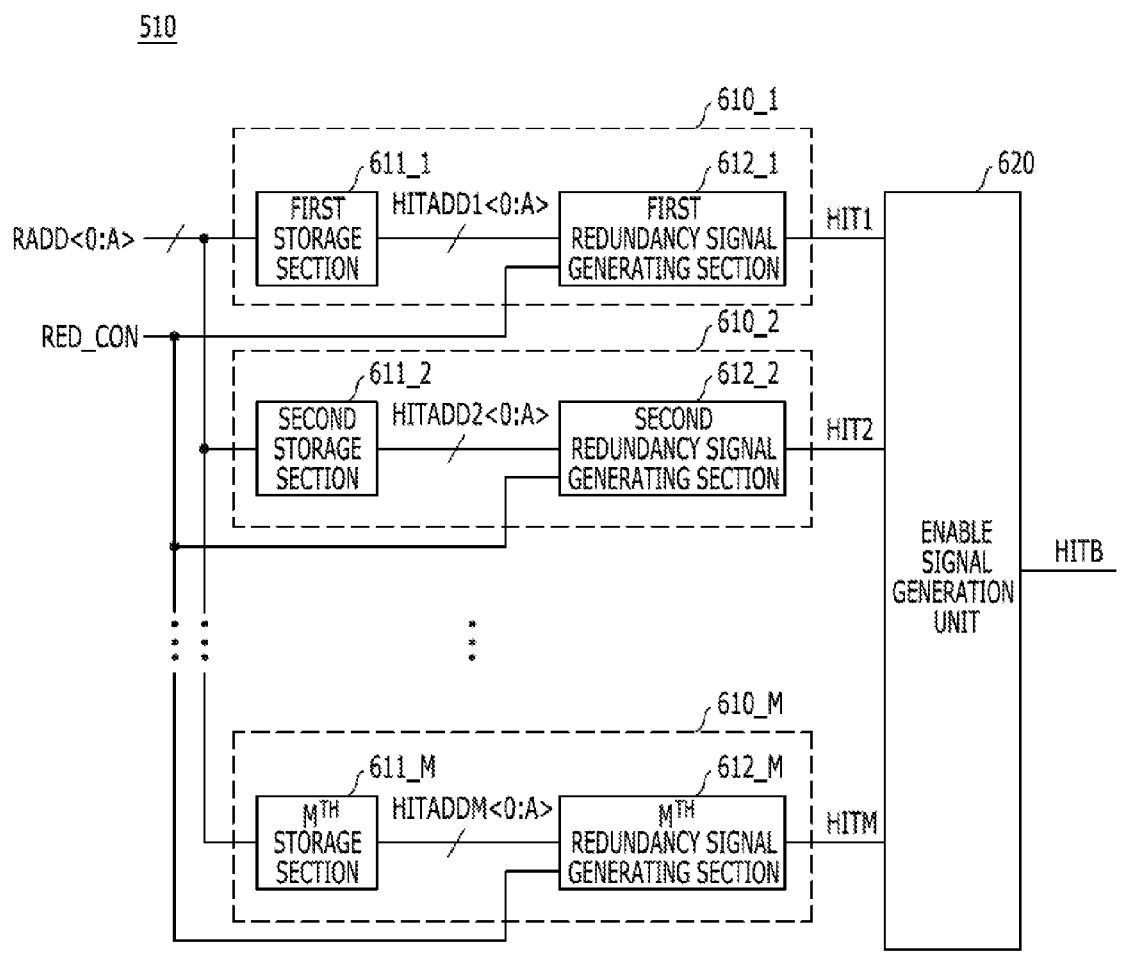
FIG. 6 is a configuration diagram illustrating a redundancy control unit in accordance with the embodiment of the present invention.

FIG. 6 is a detailed configuration diagram of the redundancy control unit 510 shown in FIG. 5.

The redundancy control block 510 includes first to $M^{th}$ unit redundancy control units 610_1 to 610_M each configured to activate its redundancy signal in the case where the value of an inputted address RADD<0:A> is identical to the value stored therein, and an enable signal generation unit 620 configured to generate the redundancy enable signal HITB that is activated when at least one redundancy signal among the first to $M^{th}$ redundancy signals HIT1 to HITM is activated.

The configurations and operations of the first to $M^{th}$ unit redundancy control units 610_1 to 610_M are substantially the same. The configuration and operation of an $M^{th}$ unit redundancy control unit 610_M among the first to $M^{th}$ unit redundancy control units 610_1 to 610_M will be described below.

The $M^{th}$ unit redundancy control unit 610_M includes an $M^{th}$ storage unit 611_M configured to store the address of a word line to replace and generate $M^{th}$ comparison information HITADDM<0:A> by comparing the respective bits of the value stored therein and the respective bits of an inputted address RADD<0:A>, and an $M^{th}$ redundancy signal generating unit 612_M configured to generate an $M^{th}$ redundancy signal HITM and update the state of the $M^{th}$ redundancy signal HITM in response to the $M^{th}$ comparison information HITADDM<0:A> in the state in which the redundancy control signal RED_CON is activated.

The M$^{th}$ storage unit 611_M activates all bits of the M$^{th}$ comparison information HITADDM<0:A> in the case where all bits of the value stored therein and all bits of the inputted address RADD<0:A> are the same with one another. The M$^{th}$ redundancy signal generating unit 612_M activates the M$^{th}$ redundancy signal HITM when all bits of the M$^{th}$ comparison information HITADDM<0:A> are activated in the state in which the redundancy control signal RED_CON is activated, and deactivates the M$^{th}$ redundancy signal HITM in the case where even any one of all bits of the M$^{th}$ comparison information HITADDM<0:A> is not activated in the state in which the redundancy control signal RED_CON is activated. In the case where the redundancy control signal RED_CON is deactivated, the M$^{th}$ redundancy signal generating unit 612_M causes the M$^{th}$ redundancy signal HITM to maintain the state at the time when the redundancy control signal RED_CON is deactivated, regardless of whether all bits of the M$^{th}$ comparison information HITADDM<0:A> are activated.

Figure 7:
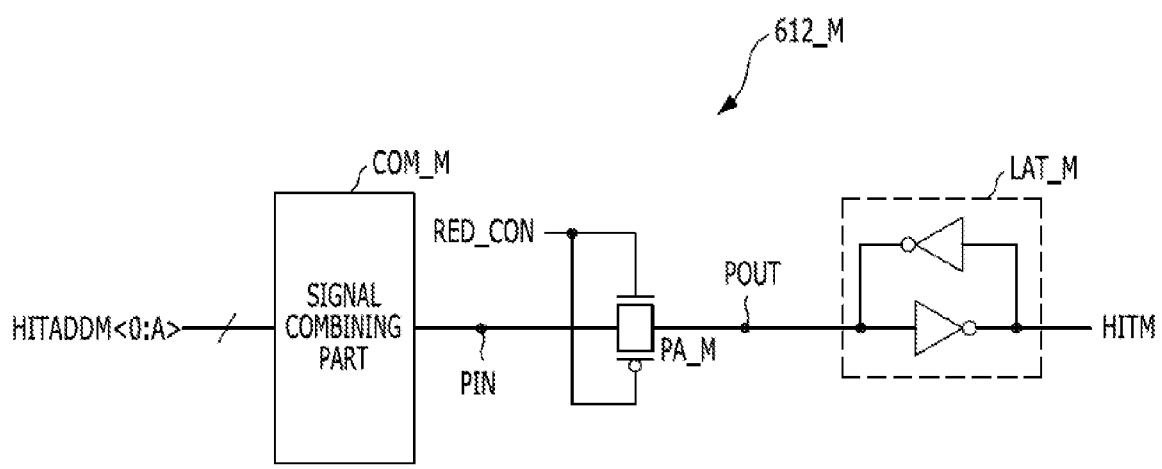
FIG. 7 is a configuration diagram illustrating a Kth redundancy signal generating unit.

FIG. 7 is a detailed configuration diagram of the M$^{th}$ redundancy signal generating unit 612_M shown in FIG. 6.

Referring to FIG. 7, the M$^{th}$ redundancy signal generating unit 612_M includes a pass gate PA_M configured to allow or intercept the transfer of an input thereto as an output in response to the redundancy control signal RED_CON, a signal combining unit COM_M configured to activate (to a low level) the input to the pass gate PA_M in the case where all bits of the M$^{th}$ comparison information HITADDM<0:A> are activated, and a latch LAT_M configured to invert the output value of the pass gate PA_M and latch the output value of the pass gate PA_M in the case where input to the pass gate PA_M is blocked.

The signal combining unit COM_M activates (to a low level) an input PIN to the pass gate PA_M in the case where all respective bits of the M$^{th}$ comparison information HITADDM<0:A> are activated (to a high level) and deactivates (to a high level) the input PIN to the pass gate PA_M in the case where even one of the respective bits of the M$^{th}$ comparison information HITADDM<0:A> is deactivated (to the low level). The pass gate PA_M transfers the input PIN thereto as an output POUT in the case where the redundancy control signal RED_CON is activated and intercepts the transfer of the input PIN thereto as the output POUT in the case where the redundancy control signal RED_CON is deactivated.

Referring back to FIG. 6, the enable signal generation unit 620 activates (to a low level) the redundancy enable signal HITB when at least one redundancy signal among the first to M$^{th}$ redundancy signals HIT1 to HITM is activated, and deactivates the redundancy enable signal HITB when all the first to M$^{th}$ redundancy signals HIT1 to HITM are deactivated.

Circuit configurations may be easily modified according to variation of signal, which is active high or low. Also, in the case of the memory and the memory system described above, while a normal word line or a redundancy word line as an over-activated word line corresponding to an excessive input address inputted when the active signal RACTV is first activated in the compensation cycle is activated, it is not inevitably necessary to activate the over-activated word line because the data of the memory cells connected to the over-activated word lines which have the actual numbers of activation times greater than the reference number of times are not likely to be degraded. Therefore, even though an excessive input address is inputted when the active signal RACTV is first activated in the compensation cycle is replaced only an adjacent word line to the over-activated word line may be activated in response to the consecutive activated active signal RACTV without activation of the over-activated word lines.

Figure 8:
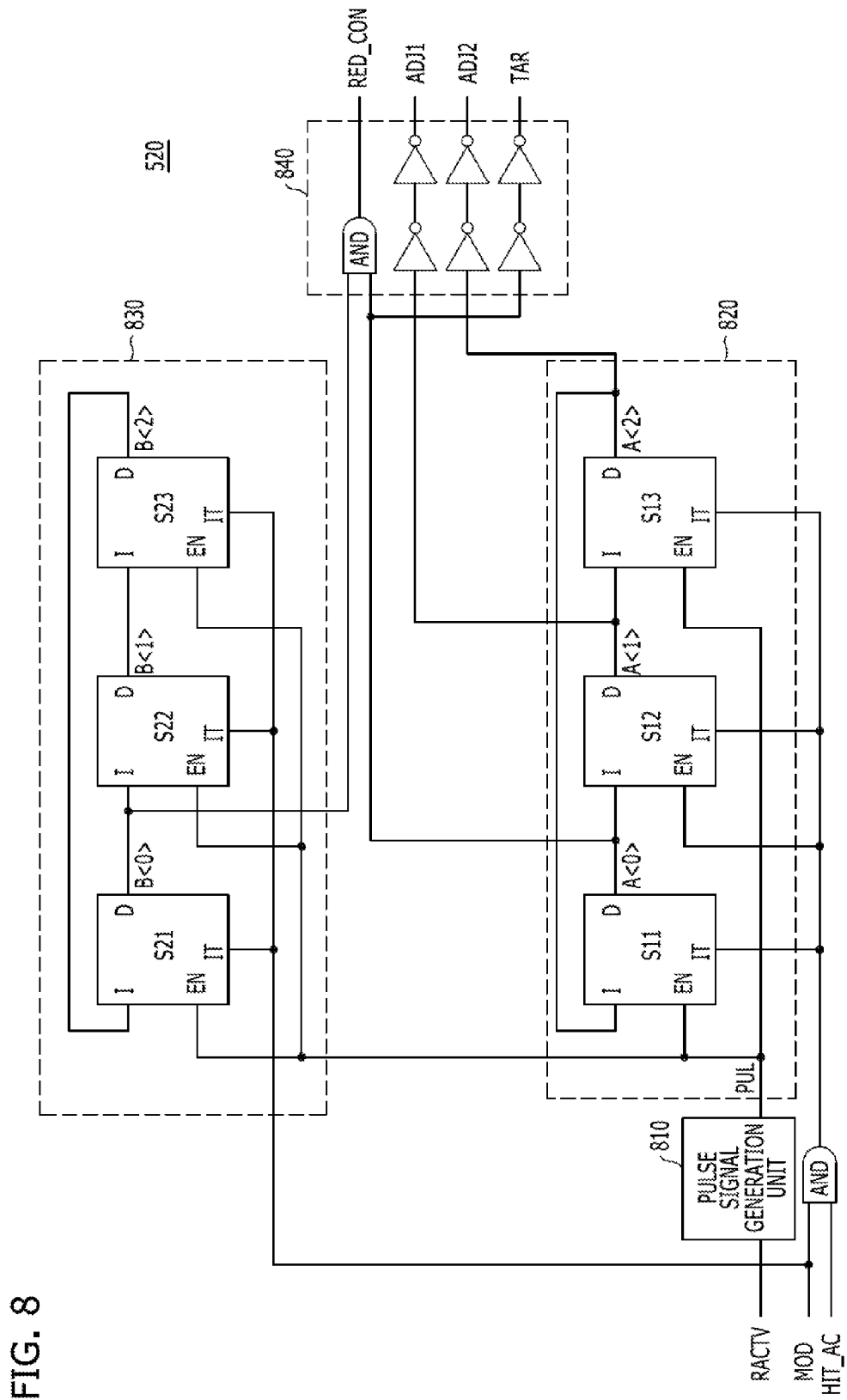
FIG. 8 is a configuration diagram illustrating an adjacent activation control block in accordance with the embodiment of the present invention.

FIG. 8 is a detailed configuration diagram of the adjacent activation control block 520 shown in FIG. 5.

Referring to FIG. 8, the adjacent activation control block 520 includes a pulse generation unit 810 configured to generate a pulse signal PUL having a predetermined duration at a deactivation time of the active signal RACTV, a first shifting unit 820, a second shifting unit 830, and a signal generation unit 840.

Operations of the adjacent activation control block 520 will be described below with reference to FIG. 8.

The pulse generation unit 810 generates the pulse signal PUL having the predetermined duration at each deactivation time of the active signal RACTV and transfers the generated pulse signal PUL to the first shifting unit 820 and the second shifting unit 830.

The first shifting unit 820 includes a plurality of first unit shifting units S11, S12 and S13 that are connected in series. While the plurality of first unit shifting units S11, S12 and S13 are in initial states, if the mode signal MOD and the redundancy word line state signal HIT_AC are activated, the plurality of first unit shifting units S11, S12 and S13 shift their outputs each time the pulse signal PUL is activated and generate a plurality of first signals A<0:2>. A<0> is the output of the first unit shifting unit S11, A<1> is the output of the first unit shifting unit S12, and A<2> is the output of the first unit shifting unit S13. In the initial states, the initial values of the plurality of first signals A<0:2> are (A<0>, A<1>, A<2>)=(1, 0, 0).

The second shifting unit 830 includes a plurality of second unit shifting units S21, S22 and S23 that are connected in series. While the plurality of second unit shifting units S21, S22 and S23 are in initial states, if the mode signal MOD is activated, the plurality of second unit shifting units S21, S22 and S23 shift their outputs each time the pulse signal PUL is activated and generate a plurality of second signals B<0:2>. B<0> is the output of the second unit shifting unit S21, B<1> is the output of the second unit shifting unit S22, and B<2> is the output of the second unit shifting unit S23. In the initial states, the initial values of the plurality of second signals B<0:2> are (B<0>, B<1>, B<2>)=(1, 0, 0).

The signal generation unit 840 is configured to combine the plurality of first signals A<0:2> and the plurality of second signals B<0:2> and to generate the redundancy control signal RED_CON, the target control signal TAR, the first adjacent control signal ADJ1 and the second adjacent control signal ADJ2. In detail, the signal generation unit 840 generates the redundancy control signal RED_CON by logical AND operation to the first signal A<0> and the second signal B<0>, generates the target control signal TAR by driving the first signal A<0>, generates the first adjacent control signal ADJ1 by driving the first signal A<1>, and generates the second adjacent control signal ADJ2 by driving the first signal A<2>.

Among the respective terminals of the plurality of first unit shifting units S11, S12 and S13 and the plurality of second unit shifting units S21, S22 and S23, I terminals indicate input terminals, D terminals indicate output terminals, EN terminals indicate enable terminals, and IT terminals indicate initialization terminals. In the state in which the initialization terminals IT are deactivated, the respective unit shifting units receive and store the signals inputted through the input terminals I, and output stored values through the output terminals D. The respective unit shifting units output initial values in the state in which the initialization terminals IT are activated. The initial values of the first signal A<0> and the second signal B<0> as the output signals of the unit shifting units S11 and S21 are 1, and the initial values of the first signals A<1> and A<2> and the second signals B<1> and B<2> as the output signals of the unit shifting units S12, S13, S22 and S23 are 0.

Hereinafter, descriptions will be made for which values the plurality of first signals A<0:2>, the plurality of second signals B<0:2>, the redundancy control signal RED_CON, the target control signal TAR, the first adjacent control signal ADJ1 and the second adjacent control signal ADJ2 have during the operations of the memory.

In the state in which the mode signal MOD and the redundancy word line state signal HIT_AC are activated (in case (A) or (B) described above), all the signals applied to the initialization terminals IT of the plurality of first unit shifting units S11, S12 and S13 and the plurality of second unit shifting units S21, S22 and S23 are deactivated. Accordingly, all of the plurality of first unit shifting units S11, S12 and S13 and the plurality of second unit shifting units S21, S22 and S23 perform shifting operations in response to the pulse signal PUL that is inputted through the enable terminals EN.

In the initial state and during the period in which the active signal RACTV is first activated in the compensation cycle, (A<0>, A<1>, A<2>)=(1, 0, 0) and (B<0>, B<1>, B<2>)=(1, 0, 0) are maintained. At this time, the redundancy control signal RED_CON and the target control signal TAR are in the activated states, and the first adjacent control signal ADJ1 and the second adjacent control signal ADJ2 are in the deactivated states.

If the first activated active signal RACTV is deactivated, changes are made to (A<0>, A<1>, A<2>)=(0, 1, 0) and (B<0>, B<1>, B<2>)=(0, 1, 0), and these values are maintained until the second activated active signal RACTV is deactivated in the compensation cycle. At this time, the redundancy control signal RED_CON and the target control signal TAR are in the deactivated states, the first adjacent control signal ADJ1 is in the activated state, and the second adjacent control signal ADJ2 is in the deactivated state.

If the second activated active signal RACTV is deactivated, changes are made to (A<0>, A<1>, A<2>)=(0, 0, 1) and (B<0>, B<1>, B<2>)=(0, 0, 1), and these values are maintained until the third activated active signal RACTV is deactivated in the compensation cycle. At this time, the redundancy control signal RED_CON, the target control signal TAR and the first adjacent control signal ADJ1 are in the deactivated states, and the second adjacent control signal ADJ2 is in the activated state.

Finally, the third activated active signal RACTV is deactivated, and changes are made to (A<0>, A<1>, A<2>)=(1, 0, 0) and (B<0>, B<1>, B<2>)=(1, 0, 0). That is to say, the state becomes initialized.

In the state in which the mode signal MOD is activated and the redundancy word line state signal HIT_AC is deactivated (in the case where a redundancy word line is not activated, i.e. an over-activated word line and all adjacent word lines are normal word lines in the first mode), the signals applied to the initialization terminals IT of the plurality of first unit shifting units S11, S12 and S13 maintain activated states, and the signals applied to the initialization terminals IT of the plurality of second unit shifting units S21, S22 and S23 are deactivated. Accordingly, the plurality of second unit shifting units S21, S22 and S23 perform shifting operations in response to the pulse signal PUL that is inputted through the enable terminals EN, and the plurality of first unit shifting units S11, S12 and S13 maintain the initial state (the state in which the respective bits A<0>, A<1> and A<2> of the first signals A<0:2> are (1, 0, 0)). In the initial state and during the period in which the active signal RACTV is first activated in the compensation cycle, (B<0>, B<1>, B<2>)=(1, 0, 0) is maintained.

If the first activated active signal RACTV is deactivated, changes are made to (B<0>, B<1>, B<2>)=(0, 1, 0), and these values are maintained until the second activated active signal RACTV is deactivated in the compensation cycle. At this time, the redundancy control signal RED_CON is in the deactivated state, the target control signal TAR is in the activated state, and the first adjacent control signal ADJ1 and the second adjacent control signal ADJ2 are in the deactivated states.

If the second activated active signal RACTV is deactivated, changes are made to (B<0>, B<1>, B<2>)=(0, 0, 1), and these values are maintained until the third activated active signal RACTV is deactivated in the compensation cycle. At this time, the redundancy control signal RED_CON is in the deactivated state, the target control signal TAR is in the activated state, and the first adjacent control signal ADJ1 and the second adjacent control signal ADJ2 are in the deactivated states.

Finally, the third activated active signal RACTV is deactivated, and changes are made to (B<0>, B<1>, B<2>)=(1, 0, 0). That is to say, the state becomes initialized.

In the state in which the mode signal MOD is deactivated (in the second mode), all the signals applied to the initialization terminals IT of the plurality of first unit shifting units S11, S12 and S13 and the plurality of second unit shifting units S21, S22 and S23 maintain the deactivated states. Accordingly, the plurality of first signals A<0:2> and the plurality of second signals B<0:2> maintain the initial states as (A<0>, A<1>, A<2>)=(1, 0, 0) and (B<0>, B<1>, B<2>)=(1, 0, 0). Therefore, the redundancy control signal RED_CON is in the activated state, the target control signal TAR is in the activated state, and the first adjacent control signal ADJ1 and the second adjacent control signal ADJ2 are in the deactivated states.

In case (A) or (B) of the first mode, when the consecutive active signal RACTV is activated after the first activation of the active signal RACTV in the compensation cycle, the adjacent activation control block 520 sequentially activates the internally generated adjacent control signals ADJ1 and ADJ2, such that at least one adjacent word line to the over-activated word line designated by the excessive input address inputted in the case where the active signal RACTV is first activated is activated regardless of the inputted address for the adjacent word line. Also, when the first active signal RACTV is deactivated after activation of itself in the first mode, the adjacent activation control block 520 deactivates the redundancy control signal RED_CON, such that the redundancy enable signal HITB and the first to $M^{th}$ redundancy signals HIT1 to HITM stay afterwards the states when the active signal RACTV is first activated, in the corresponding compensation cycle.

Figure 9A:
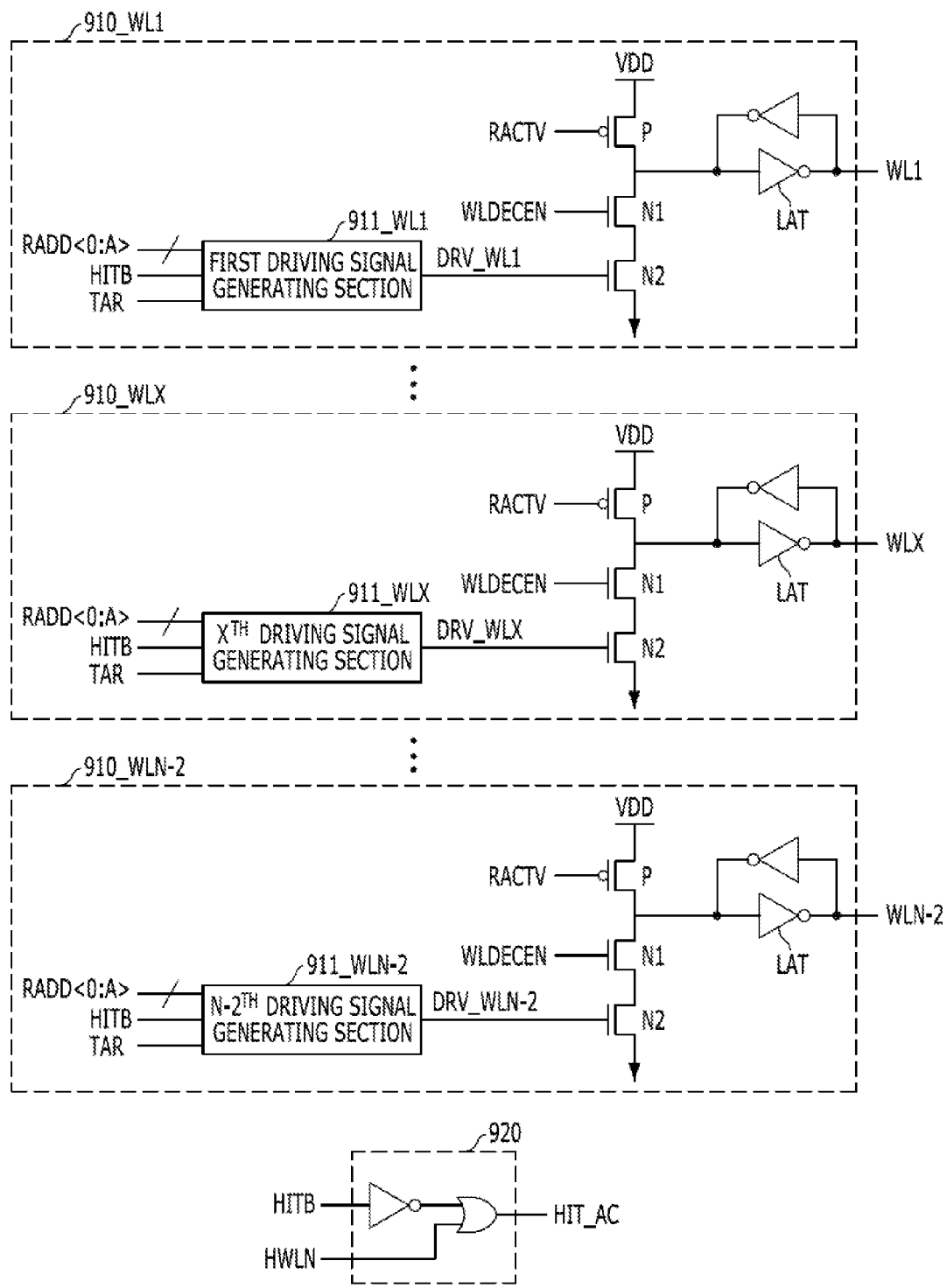
FIGS. 9A and 9B are configuration diagrams illustrating a word line control block in accordance with the embodiment of the present invention.
Figure 9B:
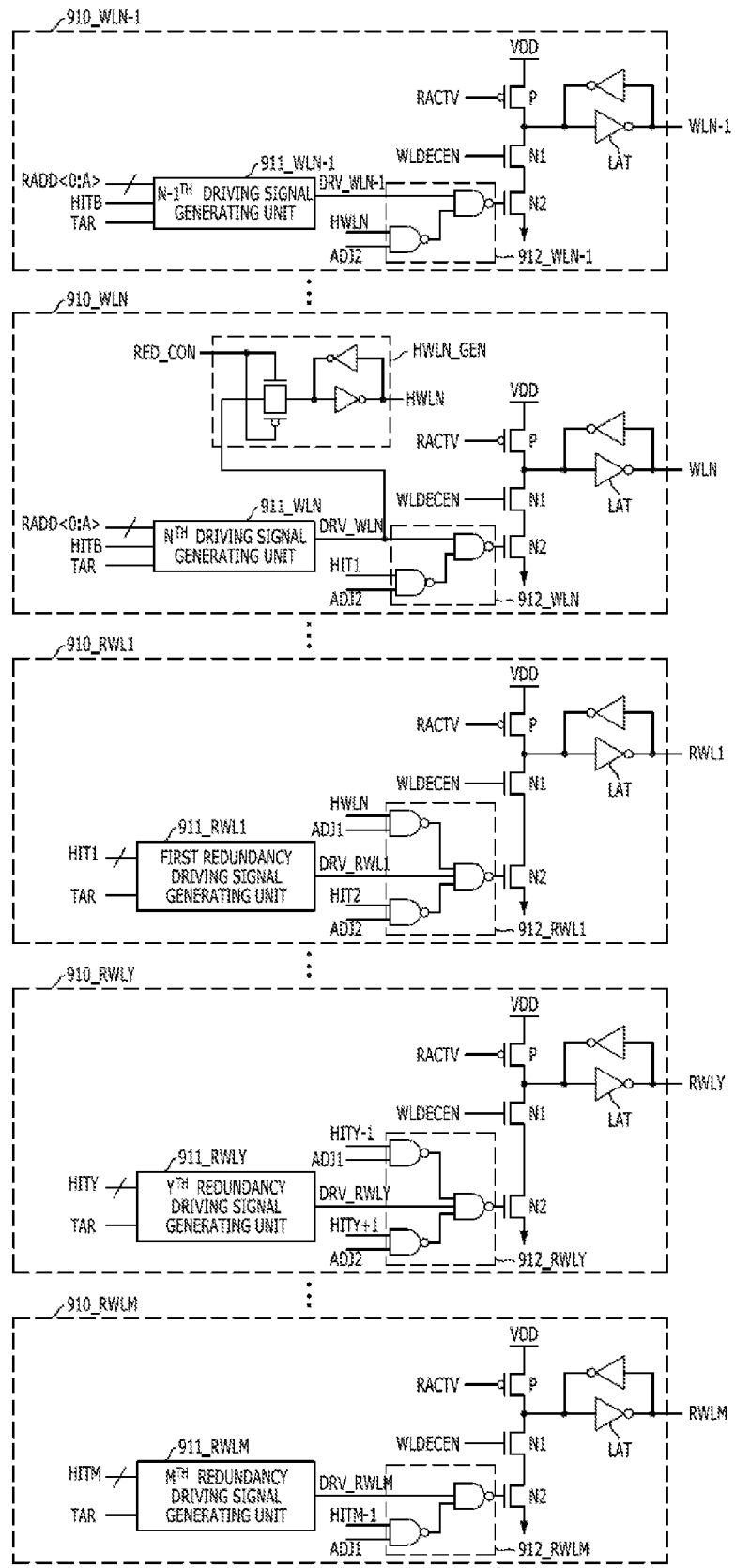

FIGS. 9A and 9B are detailed configuration diagrams of the word line control block 530 shown in FIG. 5.

FIG. 9A shows a circuit for controlling the first to $N-2^{th}$ word lines WL1 to WLN−2 in the word line control block 530, and FIG. 9B shows a circuit for controlling the $N-1^{th}$ word line WLN−1, the $N^{th}$ word line WLN, and the first to $M^{th}$ redundancy word lines RWL1 to RWLM in the word line control block 530.

The word line control block 530 will be described below with reference to FIGS. 9A and 9B.

The word line control block 530 includes unit word line control units 910_WL1 to 910_WLN and 910_RWL1 to 910_RWLM that respectively correspond to the first to $N^{th}$ word lines WL1 to WLN and the first to $M^{th}$ redundancy word lines RWL1 to RWLM, and a state signal generation unit 920 configured to generate the redundancy word line state signal HIT_AC.

The unit word line control units 910_WL1 to 910_WLN and 910_RWL1 to 910_RWLM control respective word lines that correspond to them, in response to some signals among the active signal RACTV, the word line decoding enable signal WLDECEN, the inputted address RADD<0:A>, the first to $M^{th}$ redundancy signals HIT1 to HITM, the target control signal TAR, the one or more adjacent control signals ADJ1 and ADJ2 and the redundancy enable signal HITB.

First, the configurations and the operations of the unit word line control units 910_WL1 to 910_WLN-2 shown in FIG. 9A are substantially the same. Thus, the configuration and the operation of one unit word line control unit 910_WLX ($1 \leq X \leq N-2$) among the unit word line control units 910_WL1 to 910_WLN-2 will be described below.

The unit word line control unit 910_WLX ($1 \leq X \leq N-2$) includes a PMOS transistor P configured to maintain an $X^{th}$ word line WLX in a deactivated state in the state in which the active signal RACTV is deactivated, a first NMOS transistor N1 configured to be turned on and off in response to the word line decoding enable signal WLDECEN, an $X^{th}$ driving signal generating unit 911_WLX configured to activate an $X^{th}$ driving signal DRV_WLX when the value of an inputted address RADD<0:A> is X in the state in which the target control signal TAR is activated and the redundancy enable signal HITB is deactivated, a second NMOS transistor N2 configured to be turned on and off in response to the $X^{th}$ driving signal DRV_WLX, and a latch LAT connected with the $X^{th}$ word line WLX.

The PMOS transistor P is turned on in the state in which the active signal RACTV is deactivated (to the low level), and pull-up drives the voltage of an internal node NO. The latch LAT latches and inverts the voltage of the internal node NO and pull-down drives the $X^{th}$ word line WLX. Accordingly, the $X^{th}$ word line WLX is maintained in a deactivated state. If the active signal RACTV is activated (to the high level), the PMOS transistor is turned off, and a preparation for activating the $X^{th}$ word line WLX is completed.

After a predetermined time lapses from the activation time of the active signal RACTV, the word line decoding enable signal WLDECEN is activated, and the first NMOS transistor N1 is turned on. In the case where the inputted address RADD<0:A> has the value of X, the $X^{th}$ driving signal generating unit 911_WLX activates the $X^{th}$ driving signal DRV_WLX (to a high level) at a similar time. The second NMOS transistor N2 is turned in response to the $X^{th}$ driving signal DRV_WLX, the internal node NO is pull-down driven, and the latch LAT latches and inverts the voltage of the internal node NO and pull-up drives and activates the $X^{th}$ word line WLX. In the case where the inputted address RADD<0:A> does not have the value of X or the redundancy enable signal HITB is activated, since the $X^{th}$ driving signal DRV_WLX is not activated, the $X^{th}$ word line WLX is not activated.

The configurations and the operations of the unit word line control units 910_WLN-1, 910_WLN, and 910_RWL1 to 910_RWLM shown in FIG. 9B will be described below.

The unit word line control unit 910_WLN-1 for controlling the $N-1^{th}$ word line WLN-1 includes a PMOS transistor P, a first NMOS transistor N1, a second NMOS transistor N2, a latch LAT, an $N-1^{th}$ driving signal generating unit 911_WLN-1, and a transistor control unit 912_WLN-1. Operations of the PMOS transistor P, the first NMOS transistor N1, the latch LAT and the $N-1^{th}$ driving signal generating unit 911_WLN-1 are substantially the same as described above.

The transistor control unit 912_WLN-1 controls the activation of the $N-1^{th}$ word line WLN-1 as an adjacent word line when the $N^{th}$ word line WLN is activated as an over-activated word line. The transistor control unit 912_WLN-1 activates its output when an $N-1^{th}$ driving signal DRV_WLN-1 is activated in the case where the second adjacent control signal ADJ2 is not activated. Since the output of the transistor control unit 912_WLN-1 is inputted to the gate of the second NMOS transistor N2, if the output of the transistor control unit 912_WLN-1 is activated, the second NMOS transistor N2 is turned on. In the case where the second adjacent control signal ADJ2 is activated, the transistor control unit 912_WLN-1 activates its output in the case where an $N^{th}$ word line signal HWLN indicating the activation of the $N^{th}$ word line WLN is activated when the active signal RACTV is first activated in the compensation cycle. Accordingly, the second NMOS transistor N2 is turned on. In the case where the second NMOS transistor N2 is turned on, the $N-1^{th}$ word line WLN-1 is activated by the latch LAT.

The unit word line control unit 910_WLN for controlling the $N^{th}$ word line WLN includes a PMOS transistor P, a first NMOS transistor N1, a second NMOS transistor N2, a latch LAT, an $N^{th}$ driving signal generating unit 911_WLN, a transistor control unit 912_WLN, and an $N^{th}$ word line signal generating unit HWLN_GEN. Operations of the PMOS transistor P, the first NMOS transistor N1, the latch LAT and the $N^{th}$ driving signal generating unit 911_WLN are substantially the same as described above.

The transistor control unit 912_WLN controls the activation of the $N^{th}$ word line WLN as an adjacent word line when the first redundancy word line RWL1 is activated as an over-activated word line. The transistor control unit 912_WLN activates its output when an $N^{th}$ driving signal DRV_WLN is activated in the case where the second adjacent control signal ADJ2 is not activated. Since the output of the transistor control unit 912_WLN is inputted to the gate of the second NMOS transistor N2, if the output of the transistor control unit 912_WLN is activated, the second NMOS transistor N2 is turned on. In the case where the second adjacent control signal ADJ2 is activated, the transistor control unit 912_WLN activates its output in the case where the first redundancy signal HIT1 is activated. Accordingly, the second NMOS transistor N2 is turned on. In the case where the second NMOS transistor N2 is turned on, the $N^{th}$ word line WLN is activated by the latch LAT.

The $N^{th}$ word line signal generating unit HWLN_GEN generates the $N^{th}$ word line signal HWLN indicating the activation of the $N^{th}$ word line WLN when the active signal RACTV is activated for the first time in the compensation cycle. In detail, the $N^{th}$ word line signal generating unit HWLN_GEN receives the $N^{th}$ driving signal DRV_WLN, inverts the $N^{th}$ driving signal DRV_WLN into the $N^{th}$ word line signal HWLN in the case where the redundancy control signal RED_CON is activated, and transfers the $N^{th}$ word line signal HWLN. The latch LAT is included to allow the $N^{th}$ word line signal HWLN to maintain the state at the time the redundancy control signal RED_CON is deactivated even when the redundancy control signal RED_CON is deactivated.

The unit word line control unit 910_RWL1 for controlling the first redundancy word line RWL1 includes a PMOS transistor P, a first NMOS transistor N1, a second NMOS transistor N2, a latch LAT, a first redundancy driving signal generating unit 911_RWL1, and a transistor control unit 912_RWL1. Operations of the PMOS transistor P, the first NMOS transistor N1 and the latch LAT are substantially the same as described above.

The first redundancy driving signal generating unit 911_RWL1 activates a first redundancy driving signal DRV_RWL1 when the target control signal TAR and the first redundancy signal HIT1 are activated together. The transistor control unit 912_RWL1 controls the activation of the first redundancy word line RWL1 as an adjacent word line when the second redundancy word line RWLY2 or the $N^{th}$ normal word line WLN is activated as an over-activated word line. The transistor control unit 912_RWL1 activates its output in the case where the first redundancy driving signal DRV_RWL1 is activated, in the case where the first adjacent control signal ADJ1 and the $N^{th}$ word line signal HWLN are activated together or in the case where the second adjacent control signal ADJ2 and the second redundancy signal HIT2 are activated together. Accordingly, the second NMOS transistor N2 is turned on. In the case where the second NMOS transistor N2 is turned on, the first redundancy word line RWL1 is activated by the latch LAT.

The configurations and the operations of the unit word line control units 910_RWL2 to 910_RWLM shown in FIG. 9B are substantially the same. Thus, the configuration and the operation of one unit word line control unit 910_RWLY ($2 \leq Y \leq M$) among the unit word line control units 910_RWL2 to 910_RWLM will be described below.

The unit word line control unit 910_RWLY for controlling an $Y^{th}$ redundancy word line RWLY includes a PMOS transistor P, a first NMOS transistor N1, a second NMOS transistor N2, a latch LAT, an $Y^{th}$ redundancy driving signal generating unit 911_RWLY, and a transistor control unit 912_RWLY. Operations of the PMOS transistor P, the first NMOS transistor N1 and the latch LAT are substantially the same as described above.

The $Y^{th}$ redundancy driving signal generating unit 911_RWLY activates a $Y^{th}$ redundancy driving signal DRV_RWLY when the target control signal TAR and a $Y^{th}$ redundancy signal HITY are activated together. The transistor control unit 912_RWLY controls the activation of the $Y^{th}$ redundancy word line RWLY as an adjacent word line when the $Y-1^{th}$ redundancy word line RWLY-1 or the $Y+1^{th}$ redundancy word line RWLY+1 is activated as an over-activated word line. The transistor control unit 912_RWLY activates its output in the case where the $Y^{th}$ redundancy driving signal DRV_RWLY is activated, in the case where the first adjacent control signal ADJ1 and a $Y-1^{th}$ redundancy signal HITY-1 are activated together or in the case where the second adjacent control signal ADJ2 and a $Y+1^{th}$ redundancy signal HITY+1 are activated together. Accordingly, the second NMOS transistor N2 is turned on. In the case where the second NMOS transistor N2 is turned on, the $Y^{th}$ redundancy word line RWLY is activated by the latch LAT.

In the case of the $N-1^{th}$ word line WLN-1, the unit word line control unit 910_WLN-1 has the above-described configuration such that the $N-1^{th}$ word line WLN-1 is activated when the second adjacent control signal ADJ2 is activated in the case where the $N^{th}$ word line WLN is activated when the active signal RACTV is activated for the first time in the compensation cycle and is activated in the remaining cases when a word line corresponding to an inputted address RADD<0:A> is the $N-1^{th}$ word line WLN-1.

In the case of the $N^{th}$ word line WLN, the unit word line control unit 910_WLN has the above-described configuration such that the $N^{th}$ word line WLN is activated when the second adjacent control signal ADJ2 is activated in the case where the first redundancy word line RWL1 is activated when the active signal RACTV is activated for the first time in the compensation cycle and is activated in the remaining cases when a word line corresponding to an inputted address RADD<0:A> is the $N^{th}$ word line WLN.

In the case of the first redundancy word line RWL1, the unit word line control unit 910_RWL1 has the above-described configuration such that the first redundancy word line RWL1 is activated when the second adjacent control signal ADJ2 is activated in the case where the second redundancy word line RWL2 is activated when the active signal RACTV is activated for the first time in the compensation cycle, is activated when the first adjacent control signal ADJ1 is activated in the case where the $N^{th}$ word line WLN is activated when the active signal RACTV is activated for the first time in the compensation cycle, and is activated in the remaining cases when the first redundancy signal HIT1 is activated.

In the case of the $Y^{th}$ redundancy word line RWLY, the unit word line control unit 910_RWLY has the above-described configuration such that the $Y^{th}$ redundancy word line RWLY is activated when the second adjacent control signal ADJ2 is activated in the case where the $Y+1^{th}$ redundancy word line RWLY+1 is activated when the active signal RACTV is activated for the first time in the compensation cycle, is activated when the first adjacent control signal ADJ1 is activated in the case where the $Y-1^{th}$ word line RWLY-1 is activated when the active signal RACTV is activated for the first time in the compensation cycle, and is activated in the remaining cases when the $Y^{th}$ redundancy signal HITY is activated.

Referring back to FIG. 9A, the state signal generation unit 920 activates the redundancy word line state signal HIT_AC in the case where the redundancy enable signal HITB is activated or the $N^{th}$ word line signal HWLN is activated. In other words, the state signal generation unit 920 activates the redundancy word line state signal HIT_AC in the case (A) (where the redundancy enable signal HITB is activated) or the case (B) (where the $N^{th}$ word line signal HWLN is activated). Considering that the $N^{th}$ word line WLN is adjacent to the first redundancy word line RWL1, in the case where the $N^{th}$ word line WLN is activated, at least one word line among the first to $M^{th}$ redundancy word lines RWL1 to RWLM is included in at least one word line adjacent to the word line corresponding to the inputted address RADD<0:A> (the first redundancy word line RWL1 is included). The state signal generation unit 920 may be designed to activate the redundancy word line state signal HIT_AC only in one of the cases (A) and (B).

According to the description above, the first adjacent control signal ADJ1 controls the activation of an adjacent word line 'after' an over-activated word line, and the second adjacent control signal ADJ2 controls the activation of an adjacent word line 'before' the over-activated word line. The first adjacent control signal ADJ1 and the second adjacent control signal ADJ2 may be changed with each other. The embodiment shown in FIGS. 9A and 9B is designed by setting the $N^{th}$ word line WLN and the first redundancy word line RWL1 adjacent to each other, which may also vary according to a memory design.

While it was described in the above-described embodiment that the present invention is applied to the memory and the memory system that operate differently in the first mode according to whether or not adjacent word lines to an over-activated word line include at least one redundancy word line, it is to be noted that the present invention may be extended to a memory and a memory system that operate in the first mode regardless of whether or not adjacent word lines include at least one redundancy word line, and where an adjacent word line may be activated using the received excessive input address without receiving consecutive addresses in the first mode.

Such a memory includes first to $M^{th}$ word lines RWL1 to RWLM, an adjacent activation control block 520 configured to generate one or more adjacent control signals ADJ1 and ADJ2 and to sequentially activate one or more of the first to $M^{th}$ word lines RWL1 to RWLM in response to an active signal RACTV in a first mode, and a word line control block 530 configured to generate first to $M^{th}$ control signals HIT1 to HITM respectively corresponding to the first to $M^{th}$ word lines RWL1 to RWLM, to activate a $K^{th}$ control signal HITK corresponding to a $K^{th}$ word line RWMK ($1 \leq K \leq M$) in the case where an inputted address RADD<0:A> corresponds to the $K^{th}$ word line RWMK among the first to $M^{th}$ word lines RWL1 to RWLM and to activate at least one adjacent word line adjacent to the $K^{th}$ word line RWMK in response to the active signal RACTV, the one or more adjacent control signals ADJ1 and ADJ2, and the $K^{th}$ control signal HITK in the first mode.

Such an embodiment does not include the first to $N^{th}$ word lines WL1 to WLN and the redundancy control block 510 of the embodiment described above with reference to FIGS. 4 to 9. However, since operations are similar to those of the above-described embodiment, descriptions will be made below with reference to FIGS. 4 to 9 and the descriptions thereof.

The first to $M^{th}$ word lines RWL1 to RWLM correspond to the above-described first to $M^{th}$ redundancy word lines RWL1 to RWLM. Also, the first to $M^{th}$ control signals HIT1 to HITM correspond to the first to $M^{th}$ redundancy signals HIT1 to HITM. However, in the case of the present embodiment, the first to $M^{th}$ word lines RWL1 to RWLM have corresponding addresses RADD<0:A>, respectively, and each of the first to $M^{th}$ control signals HIT1 to HITM is activated when an inputted address RADD<0:A> has a value corresponding to that of the word line corresponding to it. For example, the $K^{th}$ control signal HITK is activated when an address RADD<0:A> with the value of K corresponding to the $K^{th}$ word line RWMK is inputted. The word line control block 530 includes M number of unit word line control units 910_RWL1 to 910_RWLM.

In this case, the redundancy enable signal HITB is not used, and accordingly, the unit word line control units 910_RWL1 to 910_RWLM operate regardless of the redundancy enable signal HITB. All of a plurality of first unit shifting units S11, S12 and S13 and a plurality of second unit shifting units S21, S22 and S23 of the adjacent activation control block 520 escape the initial state when a mode signal MOD is activated, and perform shifting operations each time a pulse signal PUL is activated.

As is apparent from the above descriptions, according to the various embodiments of the present invention, word lines adjacent to a word line having the number of activations equal to or greater than a reference number are activated to refresh the memory cells connected to the adjacent word lines, whereby it is possible to substantially prevent data from being degraded due to word line disturbance.

Also, according to the various embodiments of the present invention, even when a word line having the number of activations equal to or greater than a reference number is a redundancy word line replacing a normal word line, word lines adjacent to the redundancy word line are activated, whereby it is possible to substantially prevent the data of the memory cells connected to the adjacent word lines, from being degraded.

Although various embodiments have been described for illustrative purposes, it will be apparent to those skilled in the art that various changes and modifications may be made without departing from the spirit and scope of the invention as defined in the following claims.

What is claimed is:

1. A memory comprising:
   first to $N^{th}$ word lines;
   first to $M^{th}$ redundancy word lines configured to replace M number of word lines among the first to $N^{th}$ word lines; and
   a control circuit configured to activate at least one adjacent word line adjacent to a $K^{th}$ redundancy word line ($1 \leq K \leq M$) in response to an active signal, in the case where a word line corresponding to an inputted address among the first to $N^{th}$ word lines is replaced with the $K^{th}$ redundancy word line among the first to $M^{th}$ redundancy word lines in a first mode.

2. The memory according to claim 1, wherein the control circuit generates first to $M^{th}$ redundancy signals that correspond to the first to $M^{th}$ redundancy word lines, and, in the case where the word line corresponding to the inputted address is replaced with the $K^{th}$ redundancy word line in the first mode, activates a $K^{th}$ redundancy signal that corresponds to the $K^{th}$ redundancy word line among the first to $M^{th}$ redundancy word lines in response to the inputted address, and activates the adjacent word line using the $K^{th}$ redundancy signal.

3. The memory according to claim 2,
   wherein the first mode includes at least one compensation cycle, and the active signal is activated at least two times in each compensation cycle, and
   wherein, in the case where a word line corresponding to the inputted address when the active signal is first activated in the compensation cycle is replaced with the $K^{th}$ redundancy word line, the control circuit does not activate a word line corresponding to the inputted address when the active signal is activated after the first activation, and, in the case where a word line corresponding to the inputted address when the active signal is first activated in the compensation cycle is not replaced, the control circuit activates a word line corresponding to the inputted address when the active signal is activated after the first activation.

4. The memory according to claim 3, wherein, in the case where a word line corresponding to the inputted address when the active signal is activated in the compensation cycle is replaced with the $K^{th}$ redundancy word line, the control circuit activates the adjacent word line when the active signal is activated after the first activation.

5. The memory according to claim 2, wherein the first to $N^{th}$ word lines are sequentially disposed, and the first to $M^{th}$ redundancy word lines are sequentially disposed next to the $N^{th}$ word line.

6. The memory according to claim 5, wherein, in the case where a word line corresponding to the inputted address in the first mode is replaced with the $K^{th}$ redundancy word line, if the $K^{th}$ redundancy word line is the first redundancy word line, the adjacent word line includes at least one of the $N^{th}$ word line and the second redundancy word line, and, if the $K^{th}$ redundancy word line is not the first redundancy word line, the adjacent word line includes at least one of a $K-1^{th}$ redundancy word line and a $K+1^{th}$ redundancy word line.

7. The memory according to claim 1, wherein, in the case where a word line corresponding to the inputted address in a second mode is replaced with the $K^{th}$ redundancy word line, the control circuit activates the $K^{th}$ redundancy word line in response to the active signal.

8. The memory according to claim 1, wherein the active signal is activated in response to an active command and is deactivated in response to a precharge command that is applied from an outside.

9. A memory comprising:
first to $N^{th}$ word lines;
first to $M^{th}$ redundancy word lines configured to replace M number of word lines among the first to $N^{th}$ word lines;
a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line (1≤K≤M) among the first to $M^{th}$ redundancy word lines, to activate a $K^{th}$ redundancy signal that corresponds to the $K^{th}$ redundancy word line;
an adjacent activation control block configured to activate at least one adjacent control signal in the case where the word line corresponding to the inputted address among the first to $N^{th}$ word lines is replaced with the $K^{th}$ redundancy word line in a first mode; and
a word line control block configured to activate at least one adjacent word line adjacent to the $K^{th}$ redundancy word line in response to an active signal, the adjacent control signal, and the $K^{th}$ redundancy signal, in the case where the word line corresponding to the inputted address is replaced with the $K^{th}$ redundancy word line in the first mode.

10. The memory according to claim 9, wherein the adjacent activation control block deactivates the adjacent control signal in the case where the word line corresponding to the inputted address in the first mode is not replaced or in the case of a second mode.

11. The memory according to claim 10, wherein, in the case where the word line corresponding to the inputted address in the first mode is not replaced, the word line corresponding to the inputted address among the first to $N^{th}$ word lines is activated in response to the active signal.

12. The memory according to claim 11,
wherein a period of the first mode includes at least one compensation cycle, and the active signal is activated at least two times in each compensation cycle, and
wherein, in the case where a word line corresponding to the inputted address when the active signal is first activated in the compensation cycle is replaced with the $K^{th}$ redundancy word line, the adjacent activation control block activates the adjacent control signal when the active signal is activated after the first activation, and, in the case where a word line corresponding to the inputted address when the active signal is first activated in the compensation cycle is not replaced, the adjacent activation control block does not activate the adjacent control signal.

13. The memory according to claim 12, wherein, in the case where a word line corresponding to the inputted address when the active signal is first activated in the compensation cycle is replaced with the $K^{th}$ redundancy word line, the word line control block does not activate a word line corresponding to the inputted address when the active signal is activated after the first activation, and, in the case where a word line corresponding to the inputted address when the active signal is first activated in the compensation cycle is not replaced, the word line control block activates a word line corresponding to the inputted address when the active signal is activated after the first activation.

14. The memory according to claim 9, wherein the redundancy control block comprises first to $M^{th}$ units for storing addresses of word lines to be replaced among the first to $N^{th}$ word lines, the first to $M^{th}$ storage units corresponding to the first to $M^{th}$ redundancy signals, and activates the $K^{th}$ redundancy signal when the inputted address and a value stored in a $K^{th}$ storage unit among the first to $M^{th}$ storage units are identical to each other.

15. A memory system comprising:
a memory including first to $N^{th}$ word lines and first to $M^{th}$ redundancy word lines configured to replace M number of word lines among the first to $N^{th}$ word lines, and configured to activate at least one adjacent word line adjacent to a $K^{th}$ redundancy word line (1≤K≤M) in response to an active signal, in the case where a word line corresponding to an inputted address among the first to $N^{th}$ word lines is replaced with the $K^{th}$ redundancy word line among the first to $M^{th}$ redundancy word lines in a first mode; and
a memory controller configured to input an address corresponding to a word line of which the number of activations is equal to or greater than a reference number among the first to $N^{th}$ word lines in the first mode to the memory in response to a result of counting the numbers of activations of the first to $N^{th}$ word lines.

16. The memory system according to claim 15, wherein the memory generates first to $M^{th}$ redundancy signals that correspond to the first to $M^{th}$ redundancy word lines, activates a $K^{th}$ redundancy signal which corresponds to the $K^{th}$ redundancy word line among the first to $M^{th}$ redundancy word lines in response to the inputted address in the case where the word line corresponding to the inputted address is replaced with the $K^{th}$ redundancy word line in the first mode, and activates the adjacent word line using the $K^{th}$ redundancy signal.

17. The memory system according to claim 16,
wherein a period of the first mode includes at least one compensation cycle, and the active signal is activated at least two times in each compensation cycle, and
wherein, in the case where a word line corresponding to the inputted address when the active signal is first activated in the compensation cycle is replaced with the $K^{th}$ redundancy word line, the memory does not activate a word line corresponding to the inputted address when the active signal is activated after the first activation, and, in the case where a word line corresponding to the inputted address when the active signal is first activated in the compensation cycle is not replaced, the memory activates a word line corresponding to the inputted address when the active signal is activated after the first activation.

18. The memory system according to claim 16, wherein the first to $N^{th}$ word lines are sequentially disposed, and the first to $M^{th}$ redundancy word lines are sequentially disposed next to the $N^{th}$ word line.

19. The memory system according to claim 18, wherein, in the case where a word line corresponding to the inputted address in the first mode is replaced with the $K^{th}$ redundancy word line, if the $K^{th}$ redundancy word line is the first redundancy word line, the adjacent word line includes at least one of the $N^{th}$ word line and the second redundancy word line, and, if the $K^{th}$ redundancy word line is not the first redundancy word line, the adjacent word line includes at least one of a $K-1^{th}$ redundancy word line and a $K+1^{th}$ redundancy word line.

20. The memory system according to claim 15, wherein the memory controller inputs an active command and a precharge command to the memory, and the active signal is activated in response to the active command and is deactivated in response to the precharge command.

21. A memory system including a memory and a memory controller,
the memory comprising:
first to $N^{th}$ word lines;
first to $M^{th}$ redundancy word lines configured to replace M number of word lines among the first to $N^{th}$ word lines;
a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line;
an adjacent activation control block configured to sequentially activate at least one adjacent control signal in the case where the word line corresponding to the inputted address among the first to $N^{th}$ word lines is replaced with the $K^{th}$ redundancy word line in a first mode; and
a word line control block configured to activate at least one adjacent word line adjacent to the $K^{th}$ redundancy word line in response to an active signal, the adjacent control signal, and the $K^{th}$ redundancy signal, in the case where the word line corresponding to the inputted address is replaced with the $K^{th}$ redundancy word line in the first mode,
the memory controller being configured to input an address corresponding to a word line of which the number of activation times is equal to or greater than a reference number of times among the first to $N^{th}$ word lines in the first mode to the memory in response to a result of counting the numbers of activation times of the first to $N^{th}$ word lines.

22. The memory system according to claim 21,
wherein a period of the first mode includes at least one compensation cycle, and the active signal is activated at least two times in each compensation cycle, and
wherein, in the case where a word line corresponding to the inputted address when the active signal is first activated in the compensation cycle is replaced with the $K^{th}$ redundancy word line, the adjacent activation control block activates the adjacent control signal when the active signal is activated after the first activation, and, in the case where a word line corresponding to the inputted address when the active signal is first activated in the compensation cycle is not replaced, the adjacent activation control block does not activate the adjacent control signal.

23. The memory system according to claim 22, wherein, in the case where a word line corresponding to the inputted address when the active signal is first activated in the compensation cycle is replaced with the $K^{th}$ redundancy word line, the word line control block does not activate a word line corresponding to the inputted address when the active signal is activated after the first activation, and, in the case where a word line corresponding to the inputted address when the active signal is first activated in the compensation cycle is not replaced, the word line control block activates a word line corresponding to the inputted address when the active signal is activated after the first activation.

24. The memory system according to claim 22,
wherein the first to $N^{th}$ word lines are sequentially disposed, and the first to $M^{th}$ redundancy word lines are sequentially disposed next to the $N^{th}$ word line, and
wherein, in the case where a word line corresponding to the inputted address in the first mode is replaced with the $K^{th}$ redundancy word line, if the $K^{th}$ redundancy word line is the first redundancy word line, the adjacent word line includes at least one of the $N^{th}$ word line and the second redundancy word line, and, if the $K^{th}$ redundancy word line is not the first redundancy word line, the adjacent word line includes at least one of a $K-1^{th}$ redundancy word line and a $K+1^{th}$ redundancy word line.

25. A memory comprising:
first to $M^{th}$ word lines;
an adjacent activation control block configured to generate at least one adjacent control signal and to activate the adjacent control signal in response to an active signal in a first mode; and
a word line control block configured to generate first to $M^{th}$ control signals corresponding to the first to $M^{th}$ word lines, to activate, in the case where an inputted address corresponds to a $K^{th}$ word line ($1 \leq K \leq M$) among the first to $M^{th}$ word lines, a $K^{th}$ control signal that corresponds to the $K^{th}$ word line, and to activate at least one adjacent word line adjacent to the $K^{th}$ word line in response to the active signal, the adjacent control signals, and the $K^{th}$ control signal in the first mode.

26. The memory according to claim 25, wherein, in the case where the word line control block operates in a second mode, the word line control block activates the $K^{th}$ word line corresponding to the inputted address, in response to the active signal.

27. The memory according to claim 26,
wherein a period of the first mode includes at least one compensation cycle, and the active signal is activated at least two times in each compensation cycle, and
wherein the word line control block activates the $K^{th}$ word line corresponding to the inputted address when the active signal is first activated in the compensation cycle, and activates the adjacent word line when the active signal is activated after the first activation.

28. A memory comprising:
first to $N^{th}$ word lines;
first to $M^{th}$ redundancy word lines configured to replace M number of word lines among the first to $N^{th}$ word lines; and
a control circuit configured to activate at least one word line adjacent to a word line corresponding to an inputted address among the first to $M^{th}$ redundancy word lines in response to an active signal, in the case where the word line corresponding to the inputted address among the first to $N^{th}$ word lines is adjacent to the first redundancy word line in a first mode.

29. The memory according to claim 28,
wherein a period of the first mode includes at least one compensation cycle, and the active signal is activated at least two times in each compensation cycle, and
wherein, in the case where the word line corresponding to the inputted address when the active signal is first activated in the compensation cycle is adjacent to the first redundancy word line, the control circuit activates the word line adjacent to the word line corresponding to the inputted address among the first to $M^{th}$ redundancy word lines when the active signal is activated after the first activation.

30. The memory according to claim 29, wherein, in the case where the word line corresponding to the inputted address is the $N^{th}$ word line, the control circuit activates at least one word line including the first redundancy word line among the first to $M^{th}$ redundancy word lines.

31. The memory according to claim 28, wherein, in the case where the word line corresponding to the inputted address is the $N^{th}$ word line, the control circuit activates at least one word line including the $N-1^{th}$ word line among the first to $N-1^{th}$ word lines.

32. A memory comprising:
    first to $N^{th}$ word lines;
    first to $M^{th}$ redundancy word lines configured to replace M number of word lines among the first to $N^{th}$ word lines;
    a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line;
    an adjacent activation control block configured to activate at least one adjacent control signal in the case where the word line corresponding to the inputted address among the first to $N^{th}$ word lines is adjacent to the first redundancy word line in a first mode; and
    a word line control block configured to activate at least one word line adjacent to the word line corresponding to the inputted address among the first to $M^{th}$ redundancy word lines in response to an active signal, the adjacent control signal, and a signal indicating that the word line corresponding to the inputted address is selected, in the case where the word line corresponding to the inputted address is adjacent to the first redundancy word line in the first mode.

33. The memory according to claim 32,
    wherein a period of the first mode includes at least one compensation cycle, and the active signal is activated at least two times in each compensation cycle, and
    wherein, in the case where the word line corresponding to the inputted address when the active signal is first activated in the compensation cycle is adjacent to the first redundancy word line, the adjacent activation control block sequentially activates the adjacent control signal when the active signal is activated after the first activation.

34. A memory comprising:
    first to $N^{th}$ word lines;
    first to $M^{th}$ redundancy word lines configured to replace M number of word lines among the first to $N^{th}$ word lines; and
    a control circuit configured to activate, in the case where at least one adjacent word line adjacent to a word line designated by an inputted address in a first mode includes at least one word line among the first to $M^{th}$ redundancy word lines, the adjacent word line in response to an active signal.

35. The memory according to claim 34, wherein the word line designated by the inputted address is a word line that corresponds to the inputted address among the first to $N^{th}$ word lines or a redundancy word line that replaces the word line corresponding to the inputted address, among the first to $M^{th}$ redundancy word lines.

36. The memory according to claim 35, wherein the case where the adjacent word line includes at least one word line among the first to $M^{th}$ redundancy word lines is the case where the word line corresponding to the inputted address is a word line adjacent to the first redundancy word line or the case where the word line corresponding to the inputted address is replaced with a $K^{th}$ ($1 \leq K \leq M$) redundancy word line among the first to $M^{th}$ redundancy word lines.

37. A memory comprising:
    first to $N^{th}$ word lines;
    first to $M^{th}$ redundancy word lines configured to replace M number of word lines among the first to $N^{th}$ word lines;
    a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line;
    an adjacent activation control block configured to activate at least one adjacent control signal in the case where at least one adjacent word line adjacent to a word line designated by an inputted address among the first to $N^{th}$ word lines in a first mode includes at least one word line among the first to $M^{th}$ redundancy word lines; and
    a word line control block configured to activate the at least one adjacent word line in response to an active signal, the adjacent control signal, and a signal indicating that the word line designated by the inputted address is selected, in the case where the word line includes at least one word line among the first to $M^{th}$ redundancy word lines in the first mode.

38. The memory according to claim 37, wherein the word line designated by the inputted address is a word line that corresponds to the inputted address among the first to $N^{th}$ word lines or a redundancy word line that replaces the word line corresponding to the inputted address, among the first to $M^{th}$ redundancy word lines.

39. The memory according to claim 38, wherein the signal indicating that the word line designated by the inputted address is selected is a signal indicating that the word line corresponding to the inputted address is activated, in the case where the word line corresponding to the inputted address is not replaced, or the signal indicating that the word line designated by the inputted address is selected is the $K^{th}$ redundancy signal, in the case where the word line corresponding to the inputted address is replaced with the $K^{th}$ redundancy word line ($1 \leq K \leq M$) among the first to $M^{th}$ redundancy word lines.

40. A memory comprising:
    first to $N^{th}$ word lines;
    first to $M^{th}$ redundancy word lines configured to replace M number of word lines among the first to $N^{th}$ word lines;
    a redundancy control block configured to generate first to $M^{th}$ redundancy signals that correspond to the first to $M^{th}$ redundancy word lines, and, in the case where a word line corresponding to an inputted address among the first to $N^{th}$ word lines is replaced with a $K^{th}$ redundancy word line ($1 \leq K \leq M$) among the first to $M^{th}$ redundancy word lines, to activate a $K^{th}$ redundancy signal that corresponds to the $K^{th}$ redundancy word line;
    a pulse signal generation unit configured to generate a pulse signal at a deactivation time of an active signal;
    a first shifting unit configured to shift values stored therein when the pulse signal is activated in the case where a redundancy word line state signal is activated in a first mode and to generate a plurality of first signals;
    a second shifting unit configured to shift values stored therein when the pulse signal is activated in the first mode and to generate a plurality of second signals;
    a signal generation unit configured to combine the plurality of first signals and the plurality of second signals and to generate at least one adjacent control signal; and
    a word line control block configured to activate at least one adjacent word line adjacent to the $K^{th}$ redundancy word line in response to the active signal, the adjacent control signal, and the $K^{th}$ redundancy signal, in the case where the word line corresponding to the inputted address is replaced with the $K^{th}$ redundancy word line in the first mode.

41. The memory according to claim 40, wherein the redundancy word line state signal is activated in the case where the word line corresponding to the inputted address among the first to $N^{th}$ word lines is replaced with the $K^{th}$ redundancy word line in the first mode or in the case where the word line corresponding to the inputted address is adjacent to the first redundancy word line.

* * * * *